(12) United States Patent
Miyazaki et al.

(10) Patent No.: US 11,598,834 B2
(45) Date of Patent: Mar. 7, 2023

(54) MAGNETIC RESONANCE IMAGING APPARATUS

(71) Applicant: CANON MEDICAL SYSTEMS CORPORATION, Otawara (JP)

(72) Inventors: Mitsue Miyazaki, Poway, CA (US); Yoshimori Kassai, Nasushiobara (JP)

(73) Assignee: CANON MEDICAL SYSTEMS CORPORATION, Otawara (JP)

(*) Notice: Subject to any disclaimer, the term of this patent is extended or adjusted under 35 U.S.C. 154(b) by 0 days.

(21) Appl. No.: 17/305,257

(22) Filed: Jul. 2, 2021

(65) Prior Publication Data
US 2023/0003817 A1   Jan. 5, 2023

(51) Int. Cl.
*G01V 3/00*   (2006.01)
*G01R 33/54*   (2006.01)
*G01R 33/48*   (2006.01)
*G01R 33/567*   (2006.01)

(52) U.S. Cl.
CPC ......... *G01R 33/543* (2013.01); *G01R 33/482* (2013.01); *G01R 33/4816* (2013.01); *G01R 33/5673* (2013.01)

(58) Field of Classification Search
CPC .............. G01R 33/543; G01R 33/5612; G01R 33/3607; G01R 33/5659; G01R 33/583
USPC ....................................................... 324/322
See application file for complete search history.

(56) References Cited

U.S. PATENT DOCUMENTS

| 10,488,484 B2 | 11/2019 | Miyazaki et al. | |
| 2009/0082656 A1* | 3/2009 | Bayram | G01R 33/5611 |
| | | | 324/312 |
| 2015/0123659 A1* | 5/2015 | Weingartner | G01R 33/50 |
| | | | 324/309 |
| 2017/0219672 A1* | 8/2017 | Miyazaki | G01R 33/5635 |

FOREIGN PATENT DOCUMENTS

| CN | 106645945 A | * | 5/2017 | |
| EP | 1022576 B1 | * | 11/2005 | ......... G01R 33/4828 |
| WO | WO-2012129022 A1 | * | 9/2012 | ............. A61B 5/055 |
| WO | WO-2016119054 A1 | * | 8/2016 | ............. A61B 5/055 |

* cited by examiner

*Primary Examiner* — Walter L Lindsay, Jr.
*Assistant Examiner* — Frederick Wenderoth
(74) *Attorney, Agent, or Firm* — Oblon, McClelland, Maier & Neustadt, L.L.P.

(57) ABSTRACT

In one embodiment, a magnetic resonance imaging apparatus includes: a scanner that includes a static magnetic field magnet configured to generate a static magnetic field, a gradient coil configured to generate a gradient magnetic field, and a WB (Whole Body) coil configured to apply an RF pulse to an object; and processing circuitry. The processing circuitry is configured to: set (i) a pulse sequence in which a sequence element is repeated, the sequence element including at least an inversion pulse and (ii) a data acquisition sequence executed after a delay time from the inversion pulse; and cause the scanner to execute the pulse sequence by using virtual gating.

17 Claims, 15 Drawing Sheets

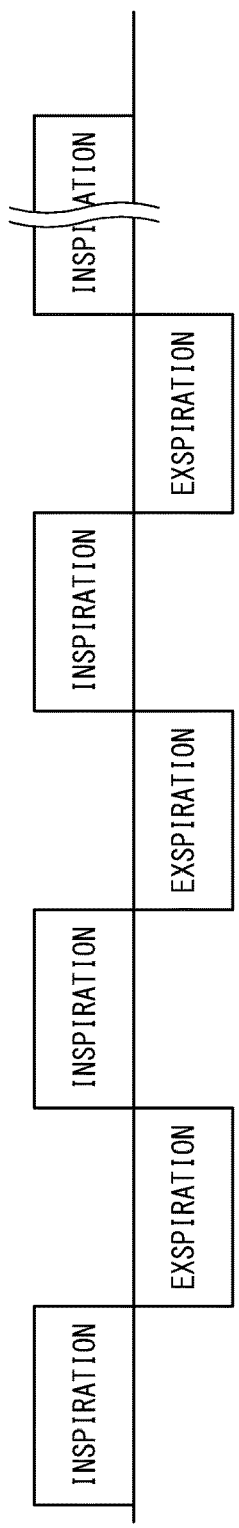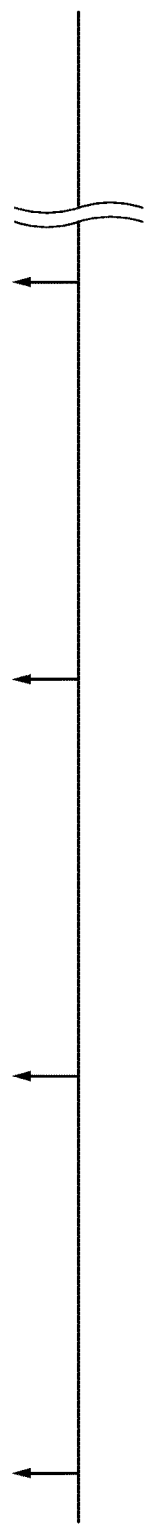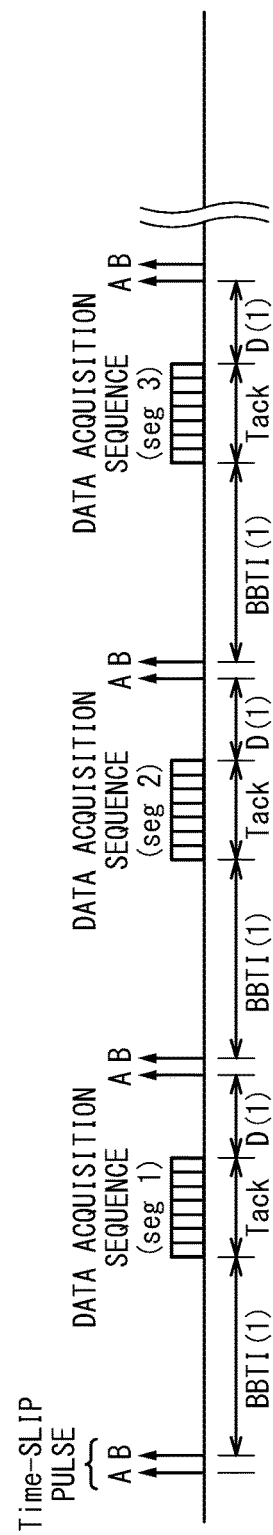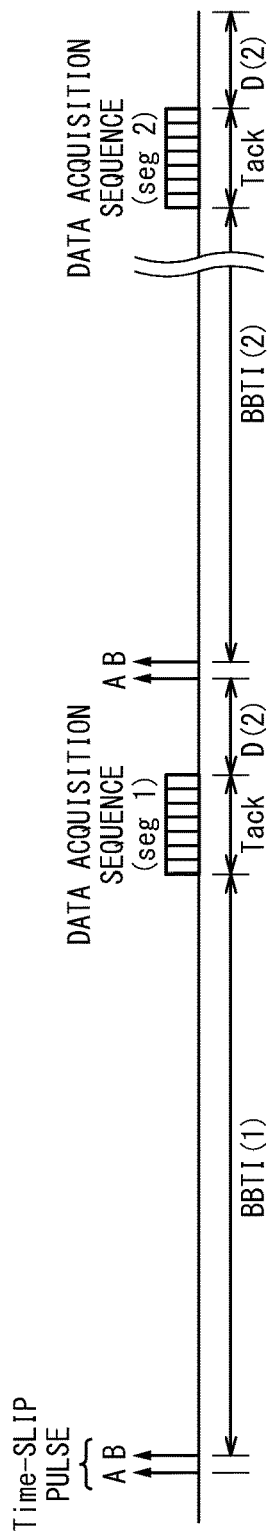

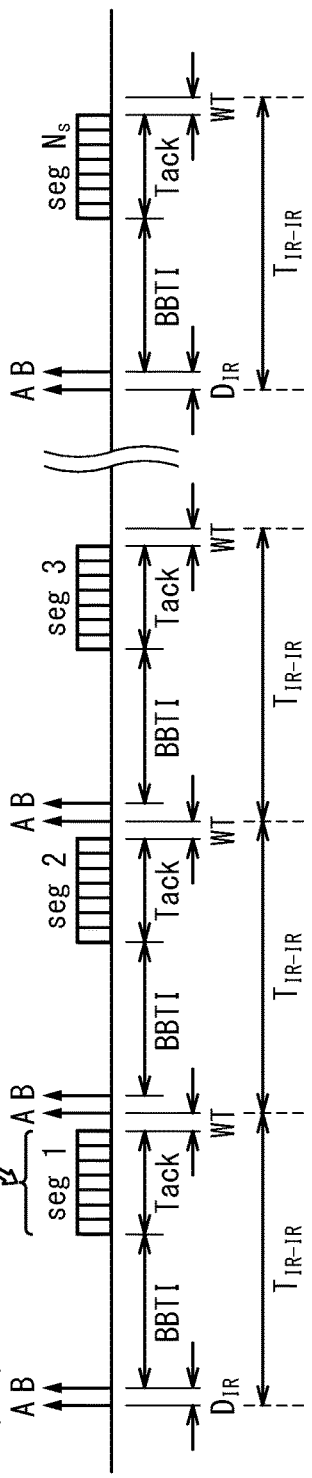
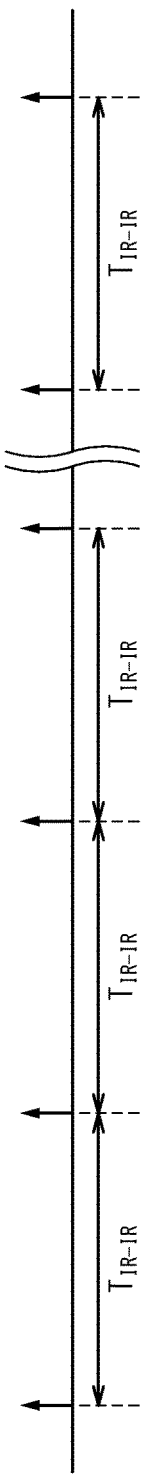
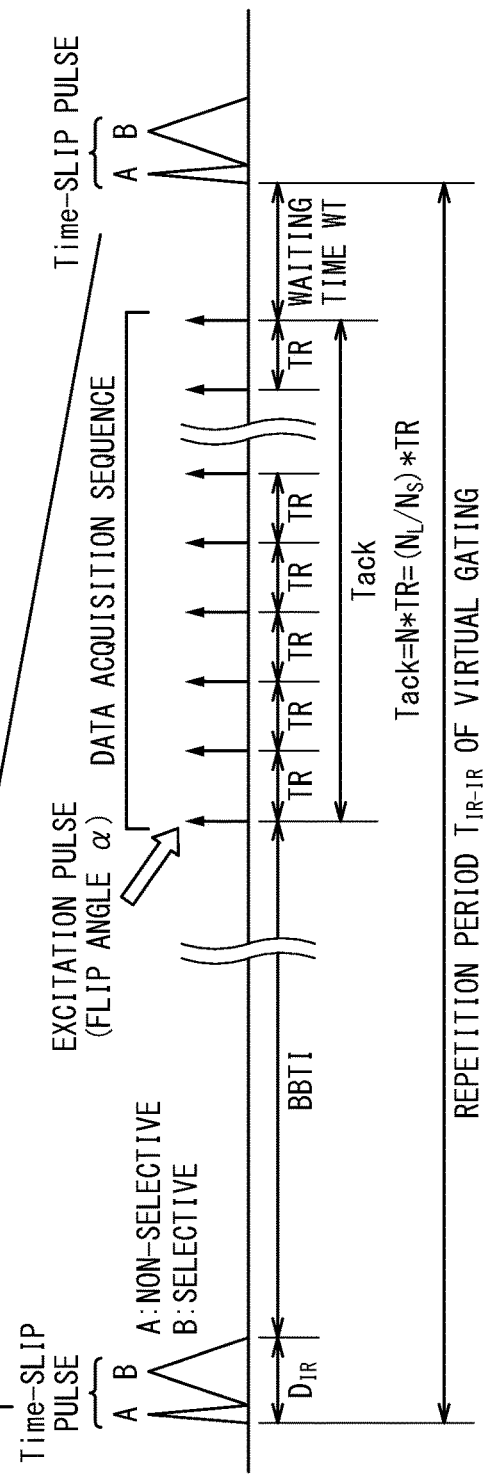
FIG. 11A Time-SLIP PULSE SEQUENCE USING VIRTUAL GATING
FIG. 11B VIRTUAL GATING SIGNAL
FIG. 11C SEQUENCE ELEMENT OF Time-SLIP PULSE SEQUENCE

FLIP ANGLE α IS 20°

FLIP ANGLE α IS 5°

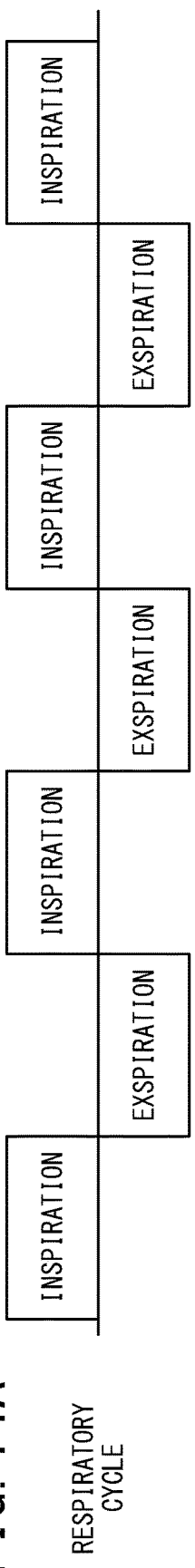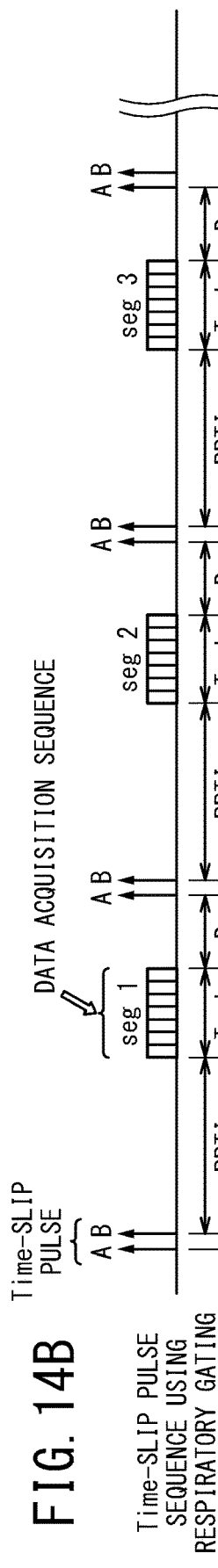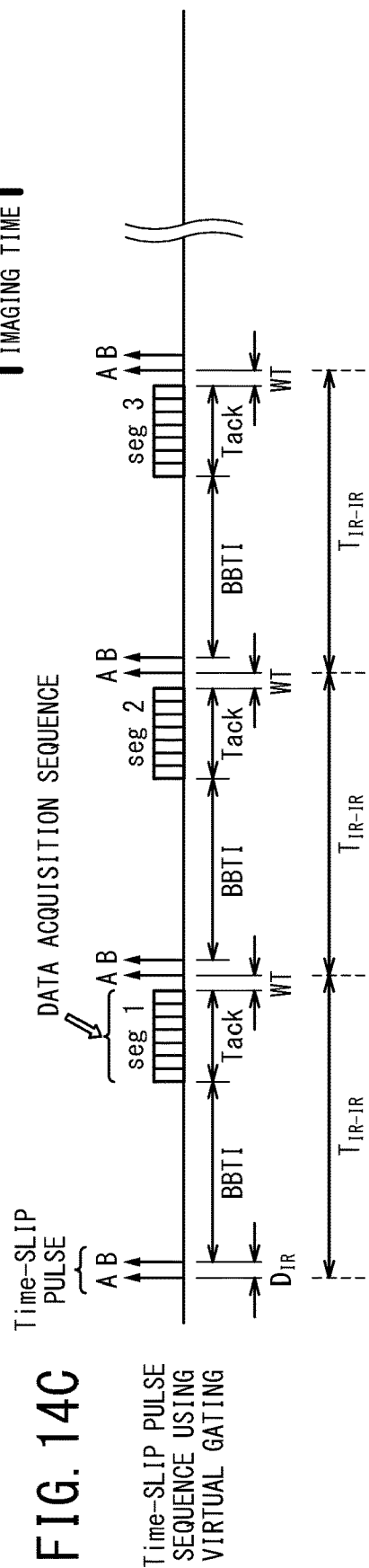

FIG. 15

EXAMPLE OF DECREASING IMAGING TIME

- DURATION $D_{IR}$ OF Time-SLIP PULSE: 100MS
- NUMBER $N_L$ OF TOTAL LINES IN k-SPACE: 16000 LINES
- NUMBER $N_S$ OF SEGMENTS: 64
- NUMBER $(N_L/N_S)$ OF LINES PER SEGMENT: 250 LINES
- REPETITION PERIOD TR OF EXCITATION PULSE: 4 ms
- DATA ACQUISITION TIME Tack PER SEGMENT: 1000 ms SETTING TIME OF BBTI: BBTI = 1000ms TOTAL TIME Ta (= $D_{IR}$ + BBTI + Tack) FROM LEADING EDGE OF Time-SLIP PULSE TO TRAILING EDGE OF DATA ACQUISITION PERIOD IS 2100 ms

VIRTUAL GATING

ASSUMING THAT BLOOD FLOWING IN FROM OUTSIDE OF IMAGING REGION IS WELL DEPICTED BY USING Time-SLIP METHOD, WITH BACKGROUND SUFFICIENTLY SUPPRESSED, WAITING TIME WT CAN BE SET TO SPECIFIED MINIMUM VALUE WTmin.
WT = WTmin = 5 ms REPETITION PERIOD $T_{IR-IR}$ OF Time-SLIP PULSE UNDER VIRTUAL GATING IS
$T_{IR-IR}$ = Ta + WT = 2100 + 5 = 2105 ms TOTAL IMAGING TIME Ttotal IS GIVEN BY
Ttotal = $T_{IR-IR}$ * NUMBER OF SEGMENTS,
Ttotal = 2105ms * 64
= <u>135 SECONDS (2 MINUTES AND 15 SECONDS)</u>

RESPIRATORY GATING

ASSUMING THAT REPETITION PERIOD Tresp OF RESPIRATORY GATING IS 5 SECONDS (5000 ms), DEAD TIME D PER PERIOD IS
Tresp-Ta = 5000-2100 = 2900 ms.

TOTAL IMAGING TIME Ttotal IS GIVEN BY
Ttotal = Tresp * NUMBER OF SEGMENTS,
Ttotal = 5 SECONDS * 64
= <u>320 SECONDS (5 MINUTES AND 20 SECONDS)</u>

MAGNETIC RESONANCE IMAGING APPARATUS

FIELD

Embodiments described herein relate generally to a magnetic resonance imaging (MRI) apparatus.

BACKGROUND

An MRI apparatus is an imaging apparatus configured to excite nuclear spin of an object placed in a static magnetic field by a radio frequency (RF) pulse applied with the Larmor frequency, and reconstruct an image based on magnetic resonance (MR) signals emitted from the object due to the excitation.

Among the imaging methods using an MRI apparatus, there is known a non-contrast enhanced imaging for imaging blood flow or blood vessels without administering a contrast medium. Further, among the various non-contrast enhanced imaging methods, a Time-SLIP (time-spatial labeling inversion pulse) method is known as an imaging method in which an RF pulse (for example, an inversion pulse) is applied prior to data acquisition to control depiction of blood flow. The Time-SLIP method is an imaging method that can clearly depict or visualize the blood flow of a target blood vessel with high contrast, while suppressing the background of the imaging region. By using the Time-SLIP method, not only blood flowing through arteries or veins but also fluid such as cerebrospinal fluid (CSF) can be imaged.

Meanwhile, ECG (electrocardiogram) gating and respiratory gating are used to suppress body-motion artifacts caused by body motions due to heartbeat and/or respiration. The ECG gating is an imaging method in which data (i.e., MR signals) are acquired within a predetermined period of a desired cardiac time phase, in synchronization with an ECG signal, for example, an R-wave. On the other hand, the respiratory gating is an imaging method in which data are acquired within a predetermined period of a predetermined time phase during expiration in a cycle consisting of inspiration and expiration, in synchronization with the respiratory signal indicating the respiratory motion detected by a respiratory sensor, for example.

In a conventional MRI apparatus, the Time-SLIP method has been used in combination with the ECG gating and/or respiratory gating to suppress body motion artifacts. When the Time-SLIP method and gating imaging, such as ECG gating and respiratory gating, are used in combination, the total imaging time tend to be long.

BRIEF DESCRIPTION OF THE DRAWINGS

In the accompanying drawings:

FIG. 5A to FIG. 5D are sequence diagrams illustrating a conventional Time-SLIP pulse sequence using actual gating (respiratory gating and/or ECG gating);

FIG. 11A to FIG. 11C are sequence diagrams of a Time-SLIP pulse sequence using virtual gating;

FIG. 14A to FIG. 14C are timing charts illustrating comparison of imaging time between virtual gating according to the present embodiment and conventional respiratory gating; and FIG. 15 is a schematic diagram illustrating comparison of imaging time between virtual gating according to the present embodiment and conventional respiratory gating.

DETAILED DESCRIPTION

Hereinafter, an MRI apparatus 1 of the present embodiment will be described by referring to the accompanying drawings.

In one embodiment, an MRI apparatus includes: a scanner that includes a static magnetic field magnet configured to generate a static magnetic field, a gradient coil configured to generate a gradient magnetic field, and a WB (Whole Body) coil configured to apply an RF pulse to an object; and processing circuitry. The processing circuitry is configured to: set (i) a pulse sequence in which a sequence element is repeated, the sequence element including at least an inversion pulse and (ii) a data acquisition sequence executed after a delay time from the inversion pulse; and to cause the scanner to execute the pulse sequence by using virtual gating.

(Configuration and Basic Operation)

Figure 1:
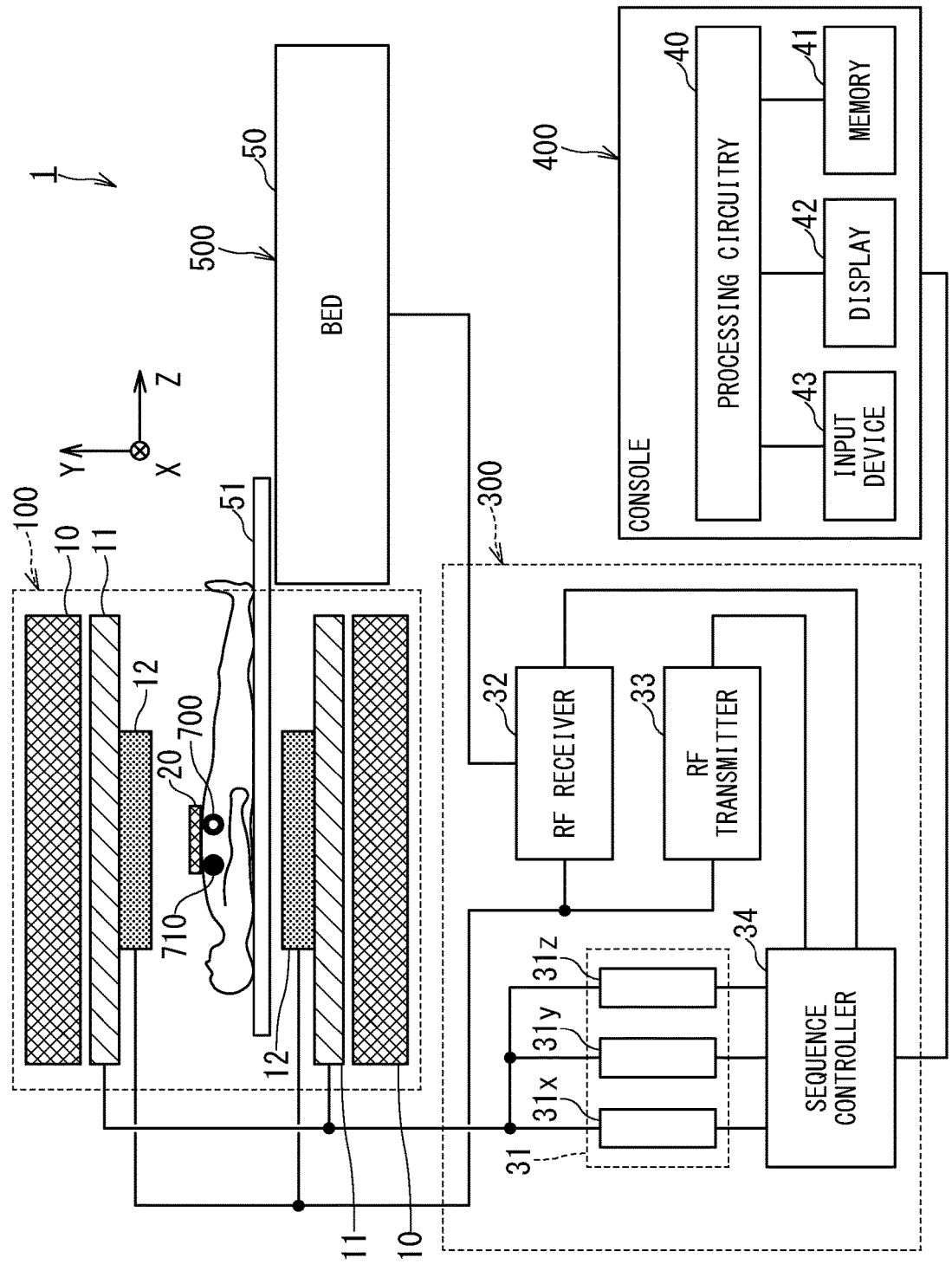
FIG. 1 is a configuration diagram illustrating overall configuration of the MRI apparatus of the present embodiment.

FIG. 1 is a block diagram illustrating overall configuration of the MRI apparatus 1 of the present embodiment. The MRI apparatus 1 of the present embodiment includes components such as a gantry 100, a control cabinet 300, a console 400, and a bed 500.

The gantry 100 includes, for example, a static magnetic field magnet 10, a gradient coil 11, a WB (whole body) coil 12, and these components are provided in a cylindrical housing. The bed 500 includes a bed body 50 and a table 51. Additionally, The MRI apparatus 1 may include an array coil 20 that is attached near an object. Further, a respiratory sensor 700 and/or an electrocardiograph 710 for respiratory gating and/or ECG (electrocardiogram) gating may be attached to the object, as described below.

The control cabinet 300 includes three gradient coil power supplies 31 (specifically, 31x for the X-axis, 31y for the Y-axis, and 31z for the Z-axis), an RF receiver 32, an RF transmitter 33, and a sequence controller 34.

The static magnetic field magnet 10 of the gantry 100 is substantially in the form of a cylinder, and generates a static magnetic field inside the bore (i.e., the space inside the cylindrical structure of the static magnetic field magnet 10) which is an imaging region of the object (for example, a patient). The static magnetic field magnet 10 includes a built-in superconducting coil, and the superconducting coil is cooled down to an extremely low temperature by liquid helium. The static magnetic field magnet 10 generates a static magnetic field by supplying the superconducting coil with electric current provided from a static magnetic field power supply (not shown) in an excitation mode. Afterward, the static magnetic field magnet 10 shifts to a permanent current mode, then the static magnetic field power supply is separated. Once it enters the permanent current mode, the static magnetic field magnet 10 continues to generate a strong static magnetic field for a long time, for example, over one year. Note that the static magnetic field magnet 10 may be configured as a permanent magnet.

The gradient coil 11 is also substantially in the form of a cylinder, and is fixed to the inside of the static magnetic field magnet 10. This gradient coil 11 applies gradient magnetic fields to the object in the respective directions of the X-axis, the Y-axis, and the Z-axis of the apparatus coordinate system, by using electric currents supplied from the gradient coil power supplies 31$x$, 31$y$, and 31$z$.

The bed body 50 of the bed 500 moves the table 51 in the upward and downward directions, and moves the table 51 with the object laid thereon to a predetermined height before imaging. Afterward, during the imaging, the bed body 50 moves the table 51 in the horizontal direction so as to move the object inside the bore.

The WB coil 12 is also shaped substantially in the form of a cylinder so as to surround the object, and is fixed to the inside of the gradient coil 11. The WB coil 12 applies RF pulses transmitted from the RF transmitter 33 to the object, and receives MR signals emitted from the object due to excitation of hydrogen nuclei.

The array coil 20 is a kind of RF coil, which is place adjacent to the object, and receives MR signals emitted from the object. The array coil 20 is, for example, consisted of a plurality of coil elements. Although there are various types of the array coil 20 such as a head coil, a chest coil, a spine coil, a lower-limb coil, and a whole-body coil depending on an anatomical imaging site of the object, the array coil 20 for the chest is illustrated in FIG. 1.

The RF transmitter 33 sends RF pulses to the WB coil 12 on the basis of commands inputted from the sequence controller 34. The RF receiver 32 receives MR signals through the WB coil 12 and/or the array coil 20, and sends raw data obtained by digitizing the received MR signals to the sequence controller 34.

The sequence controller 34 performs a scan of the object by driving the gradient coil power supplies 31, the RF transmitter 33, and the RF receiver 32, under the control of the console 400. When the sequence controller 34 receives the raw data from the RF receiver 32 by performing a scan, the sequence controller 34 sends the received raw data to the console 400.

The sequence controller 34 includes processing circuitry (not shown), which is configured as hardware such as a processor for executing predetermined programs, a field programmable gate array (FPGA), and an application specific integrated circuit (ASIC).

The console 400 is configured as a computer including processing circuitry 40, a memory 41, a display 42, and an input device 43.

The memory 41 is a recording medium including a read-only memory (ROM) and a random access memory (RAM), in addition to an external memory device such as a hard disk drive (HDD) and/or an optical disc device. The memory 41 stores various programs executed by a processor of the processing circuitry 40 in addition to various data and information.

The input device 43 includes various types of devices such as a mouse, a keyboard, a trackball, and/or a touch panel, for an operator to input various data and information.

The display 42 is a display device such as a liquid crystal display panel, a plasma display panel, and an organic EL panel.

The processing circuitry 40 is, for example, a circuit provided with a CPU and/or a special-purpose or general-purpose processor. The processor realizes various functions described below by executing programs stored in the memory 41. The processing circuitry 40 may be consisted of hardware such as an FPGA and an ASIC. The various functions described below can also be realized by such hardware. Additionally, the processing circuitry 40 can achieve the various functions by combining hardware processing and software processing based on its processor and programs.

With the above components, the console 400 performs system control of the entirety of the MRI apparatus 1. Specifically, the console 400 receives various commands and information such as imaging conditions, which are inputted by an operator such as a medical imaging technologist through the mouse and/or the keyboard of the input device 43. The processing circuitry 40 causes the sequence controller 34 to perform a scan on the basis of the inputted imaging conditions, and reconstructs images by using the raw data transmitted from the sequence controller 34. The reconstructed images may be displayed on the display 42, and may be stored in the memory 41.

Further, the MRI apparatus 1 of the present embodiment generates an image of the object by reconstructing the MR signals acquired by executing a scan under pulse sequences described below. In particular, the MRI apparatus 1 of the present embodiment performs a scan using a pulse sequence that can decrease the imaging time as compared with the conventional case.

Figure 2:
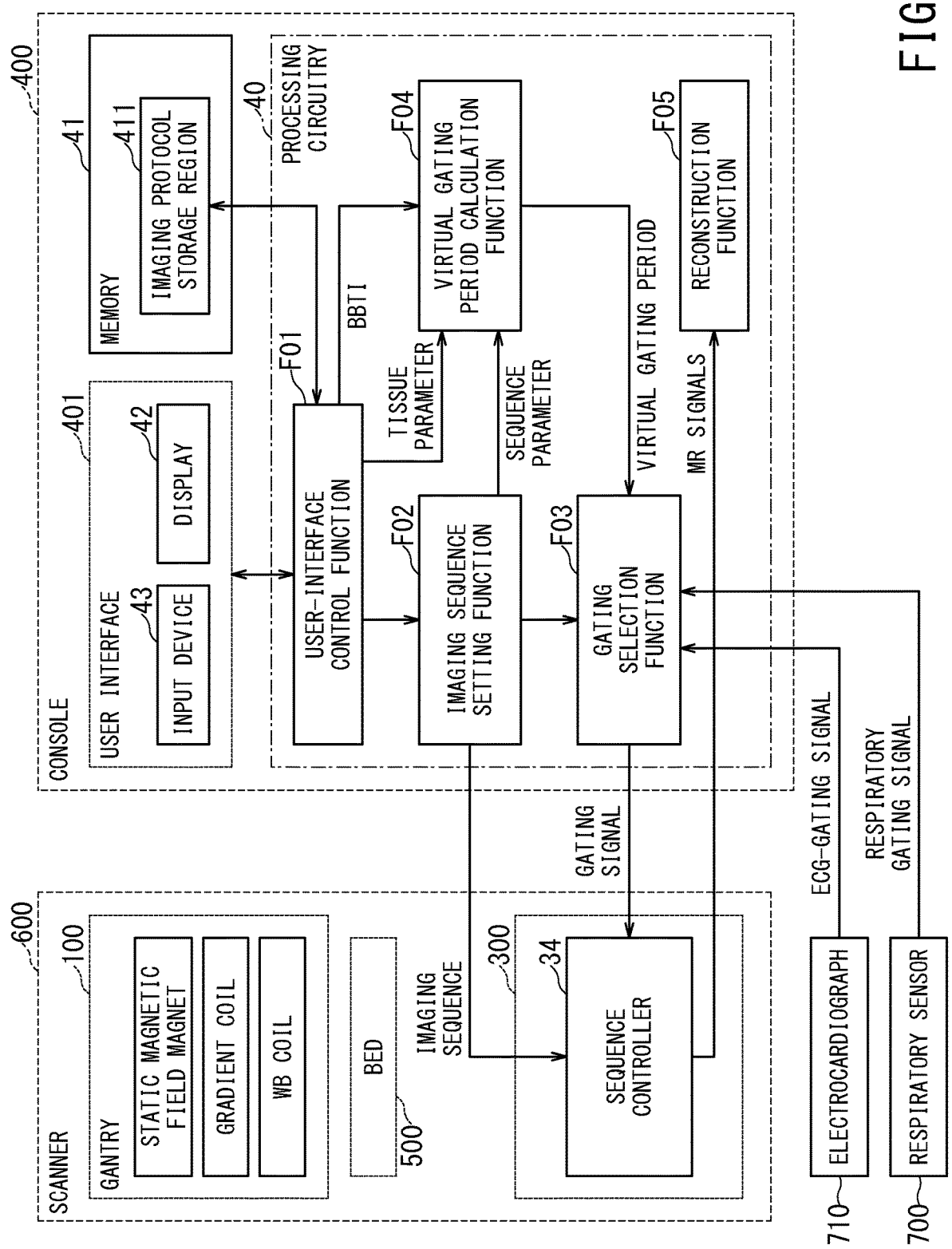
FIG. 2 is a block diagram illustrating a configuration related to setting of pulse-sequence in the MRI apparatus of the present embodiment.

FIG. 2 is a block diagram of the MRI apparatus 1 of the embodiment, and particularly a functional block diagram focusing on the functions achieved by the processing circuitry 40.

Among the components of the MRI apparatus 1 shown in FIG. 1, components excluding the console 400 (i.e., the entirety of the control cabinet 300, the gantry 100, and the bed 500) constitute a scanner 600 as illustrated in FIG. 2. In FIG. 2, the respiratory sensor 700 and the electrocardiograph 710 connected to the MRI apparatus 1 are also depicted.

As shown in FIG. 2, the processing circuitry 40 of the MRI apparatus 1 implements each of a user-interface control function F01, an imaging sequence setting function F02, a gating selection function F03, a virtual gating period calculation function F04, and a reconstruction function F05.

The user-interface control function F01 performs control for users, such as doctors and/or medical imaging technologists, to input and select various data related to imaging via the user interface 401. The user interface 401 includes, for example, the input device 43 and the display 42 described above.

The user inputs or selects data regarding the imaging conditions of the imaging to be executed via the user interface 401. Here, the imaging conditions may include, for example, a type of imaging method, a type of imaging target, FOV (field of view), resolution, and so forth. The user may input or select a specific value of each of various parameters of the pulse sequence for realizing these imaging conditions.

Types of imaging methods include, for example, sampling methods in a k-space, such as two-dimensional Cartesian sampling, three-dimensional Cartesian sampling, two-dimensional radial sampling, and three-dimensional radial sampling.

In addition, the types of imaging methods may include types of pulse sequence, for example, a FLASH (fast low angel shot) method, an SPGR (spoiled gradient-recalled acquisition in the steady state) method, a balanced-SSFP (steady-state free precession) method, an FSE (fast spin echo) method, a FASE (fast advanced spin echo) method, an EPI (echo planar imaging) method, a TOF (time of flight) method, a PC (phase contrast) method, an FBI (fresh blood imaging) method, a Time-SLIP (time-spatial labelling inversion pulse) method, a DWI (diffusion weighted Imaging) method, an ASL (arterial spin labeling) method, and so forth.

The types of imaging targets selected via the user interface 401 include, for example, (i) a site of the body of the object such as the head, chest, abdomen, and inferior limbs, (ii) the type of organs such as the brain, heart, lung, liver, and kidney, and (iii) the type of tissues such as blood, cerebrospinal fluid, and bones.

Meanwhile, a standard imaging protocol and/or a recommended imaging protocol, which correspond to imaging conditions such as the type of imaging method and the type of imaging target, are stored in an imaging protocol storage region 411 of the memory 41. The imaging protocol may include, for example, the type of pulse sequence used for imaging, values of various parameters in the pulse sequence, combinations of a plurality of pulse sequences in the case of consecutively executing the plurality of pulse sequences. The values of various parameters in the pulse sequence may include, for example, values of respective parameters related to the transmission RF pulse, such as a flip angle α of the excitation pulse, a repetition period TR of the excitation pulse and their temporal change, and values of respective parameters related to the gradient magnetic field, such as the magnitude and application time of each gradient magnetic field in the X-axis, Y-axis, and Z-axis directions and their temporal changes.

The user-interface control function F01 reads out, from the imaging-protocol storage region 411 of the memory 41, the standard imaging protocol corresponding to the imaging conditions inputted or selected by the user.

The user-interface control function F01 may display the imaging protocol read out on the display 42 of the user interface 401. The user can approve and determine the displayed imaging protocol as they are. Alternatively, if necessary, the user may change the displayed imaging protocol, and then, may determine the changed imaging protocol.

The user-interface control function F01 sends the determined imaging protocol to the imaging sequence setting function F02. The imaging sequence setting function F02 sets the data related to the pulse sequence corresponding to the received imaging protocol on the sequence controller 34 of the scanner 600, as an imaging sequence.

The sequence controller 34 executes the pulse sequence according to the data related to the set pulse sequence as described above so as to acquire the MR signals.

The acquired MR signals are sent to the reconstruction function F05 of the processing circuitry 40. The reconstruction function F05 performs reconstruction processing such as Fourier transform on the MR signals so as to generate a magnetic resonance image. The generated magnetic resonance image is displayed on the display 42, for example.

The gating selection function F03 and the virtual gating period calculation function F04 are functions related to virtual gating, which is a characteristic of the MRI apparatus 1 of the present embodiment. Hereinafter, the virtual gating will be described in detail.

(Virtual Gating)

The pulse sequence targeted by the virtual gating according to the present embodiment is mainly a pulse sequence in which a sequence element is repeated, and this sequence element includes at least an inversion pulse and a data acquisition sequence executed after a predetermined delay time from the inversion pulse.

A typical example of this type of pulse sequence is the Time-SLIP. As an example of the above-described pulse sequences, the MRI apparatus 1 of the present embodiment executes a pulse sequence by applying the Time-SLIP method using virtual gating.

Prior to description of virtual gating, the Time-SLIP method will be briefly described by referring to FIG. 3A to FIG. 3C, and FIG. 4A to FIG. 4C. In addition, execution of the Time-SLIP method using actual gating (i.e., respiratory gating and/or ECG gating), which has been conventionally performed, will be briefly described by referring to FIG. 5A to FIG. 5D.

Figure 3A:
FIG. 3A to FIG. 3C are schematic diagrams illustrating the concept of the Time-SLIP method.
Figure 3B:
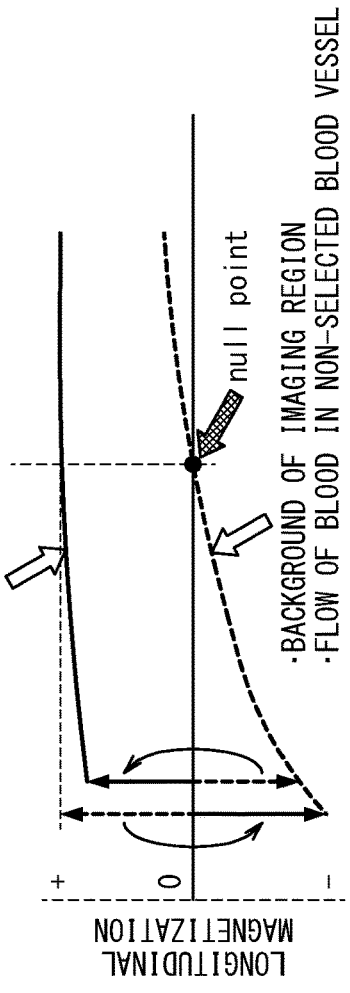
Figure 3C:
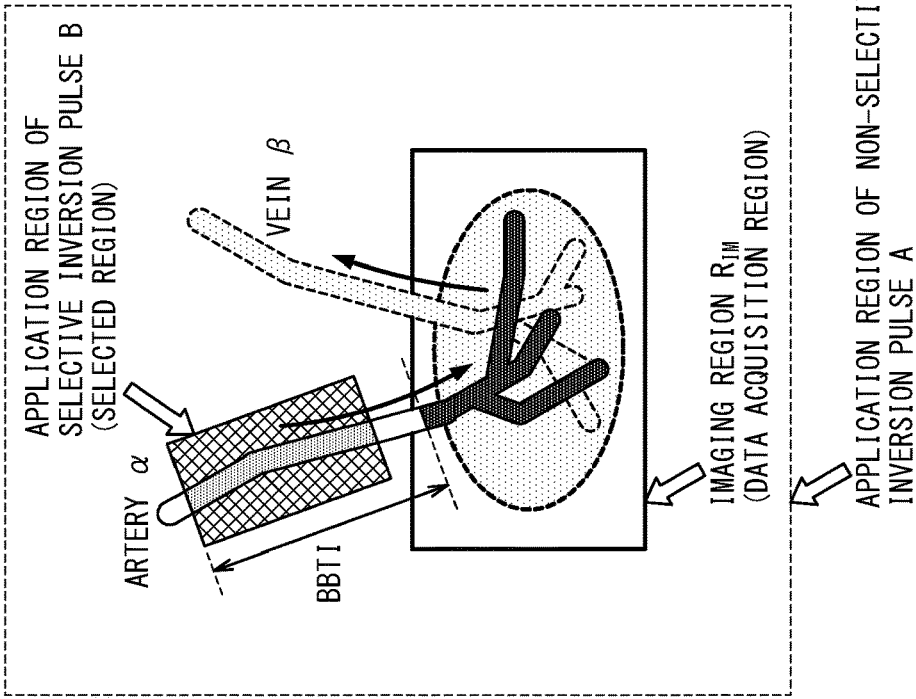

FIG. 3A to FIG. 3C are schematic diagrams illustrating an imaging method called "Flow-Out" among various Time-SLIP methods. As will be described later, in the "Flow-Out" type Time-SLIP method, two inversion pulses, a selective inversion pulse and a non-selective inversion pulse, are used. In the "Flow-Out" type Time-SLIP method, the main imaging target is the fluid flowing out from a region to which the selective inversion pulse is applied (that is, the selected region).

Figure 4C:
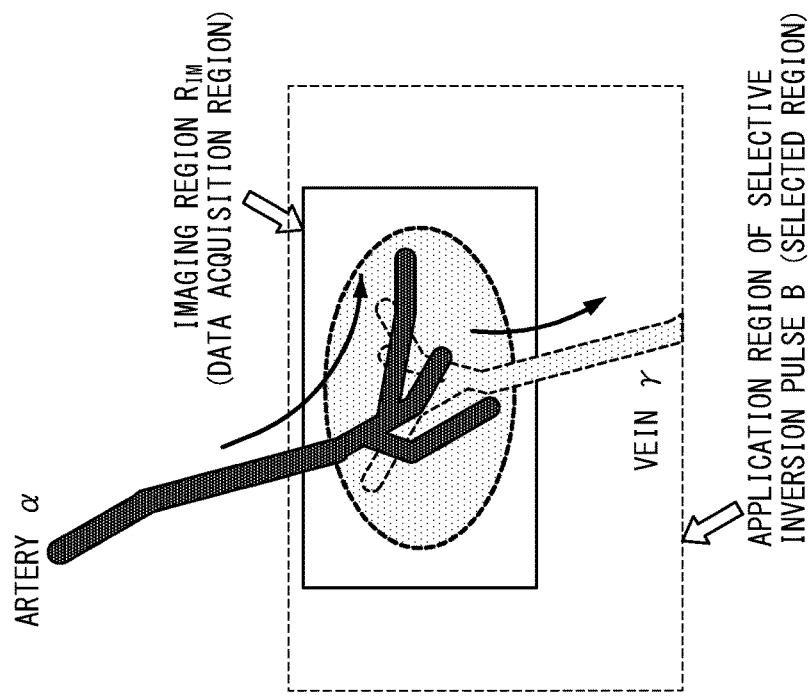
FIG. 4A to FIG. 4C are schematic diagrams illustrating the concept of the Time-SLIP method.
Figure 4A:
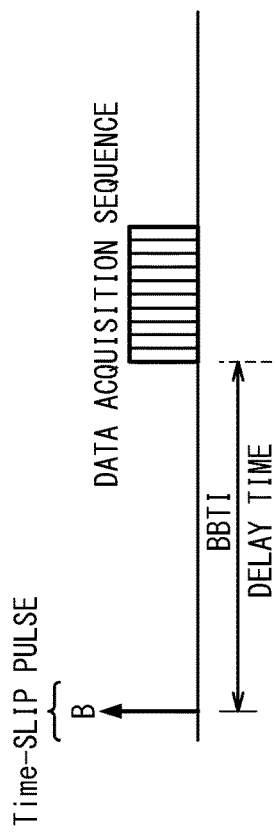
Figure 4B:
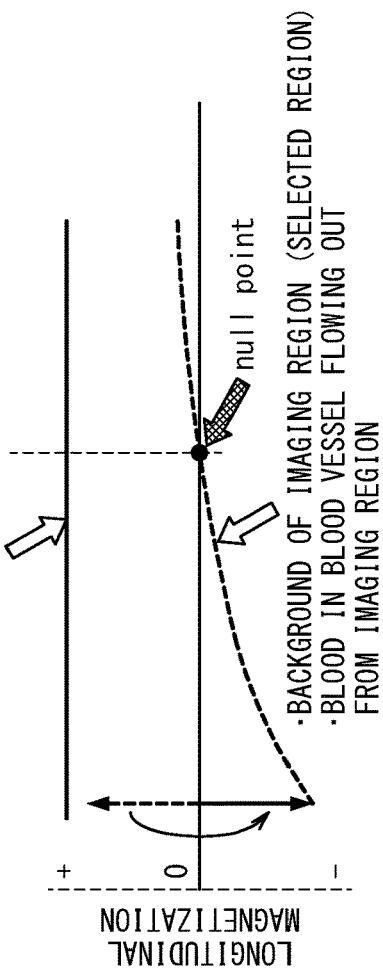

On the other hand, FIG. 4A to FIG. 4C are schematic diagrams illustrating an imaging method called "Flow-In" among various Time-SLIP methods. In the "Flow-In" type Time-SLIP method, only the selective inversion pulse is used. In the Flow-In type Time-SLIP method, the main imaging target is the fluid flowing from the outside into a region to which the selective inversion pulse is applied (that is, the selected region including the imaging region).

FIG. 3A shows a sequence diagram of the "Flow-Out" type Time-SLIP methods. In the "Flow-Out" type Time-SLIP methods, two inversion pulses are applied, and a data acquisition sequence is applied after a predetermined delay time from the two inversion pulses.

Of the two inversion pulses, a non-selective inversion pulse A may be applied first, and a selective inversion pulse B may be applied immediately after this pulse A, for example. These two pulses, i.e., the non-selective inversion pulse A and the selective inversion pulse B may be collectively referred to as a Time-SLIP pulse in the following description.

Note that the order of application of the non-selective inversion pulse A and the selective inversion pulse B may be reversed.

The delay time from the Time-SLIP pulse to the front edge of the data acquisition sequence is called BBTI ("black blood inversion time" or "black blood traveling time").

In the data acquisition sequence, MR signals are acquired by a plurality of excitation pulses. Various types of sequences can be used in the data acquisition sequence as described below. When the MR signals of the entire k-space, which are required for reconstructing a full image, cannot be acquired by one data acquisition sequence, the MR signals are acquired by dividing the entire k-space into a plurality of regions (i.e., into a plurality of segments). In this case, the sequence diagram shown in FIG. 3A is repeated by the number of segments.

The unit of repetition, i.e., the period from the front end of the Time-SLIP pulse to the front end of the next Time-SLIP pulse, is called a "sequence element" in the following description. In this case, the pulse sequence of the Time-SLIP method is composed of a plurality of sequence elements that are repeated over time by the number of segments.

FIG. 3C schematically shows an application region of the non-selective inversion pulse A, an application region of the selective inversion pulse B, and the imaging region. FIG. 3B shows behavior of longitudinal magnetization changed by application of the non-selective inversion pulse A and the selective inversion pulse B in association with the time axis of the sequence diagram of FIG. 3A.

The non-selective inversion pulse A is applied to the entire region (i.e., region of the square frame shown by the fine broken line in FIG. 3C) that includes the imaging region $R_{IM}$ shown by the thick solid square frame in FIG. 3C and the region outside the imaging region $R_{IM}$. Application of the non-selective inversion pulse A inverts the longitudinal magnetization of the background and blood in the vessels in the imaging region from positive to negative as shown in FIG. 3B. The application of the non-selective inversion pulse A also inverts the longitudinal magnetization of the blood in the arteries α and in the vein β outside the imaging region from positive to negative as shown in FIG. 3B. As shown by the broken line in FIG. 3B, these longitudinal magnetizations recover with time, crossing a null point from a negative value, and then becoming a positive value.

Meanwhile, the selective inversion pulse B is applied to a desired selected region outside the imaging region. Specifically, the selective inversion pulse B is applied to a selected region including a specific blood vessel that flows into the imaging region from the outside of the imaging region on the upstream side of the imaging region. In the case of FIG. 3C, the selective inversion pulse B is applied to the region including the artery α upstream of the imaging region. Due to application of this selective inversion pulse B, only the blood in the artery α is returned from negative longitudinal magnetization to positive longitudinal magnetization as shown by the thick solid line in FIG. 3B, and then flows into the imaging region while maintaining a large positive value of longitudinal magnetization.

Meanwhile, data acquisition is performed around the timing when the longitudinal magnetization of the background in the imaging region crosses the null point (i.e., around the time when BBTI elapses from the Time-SLIP pulse), and thereby, the blood of the artery α flowing from the outside of the imaging region can be depicted with high contrast with respect to the background of the imaging region. Although the blood of the artery β also flows in the imaging region, the selective inversion pulse B is not applied to the artery β, and thus, the longitudinal magnetization of the blood of the artery β flowing in the imaging region is maintained at a small value. In this way, in the Flow-Out type Time-SLIP methods, among a plurality of blood vessels in the imaging region, blood of the specified blood vessel only can be selectively depicted.

FIG. 4A to FIG. 4C are schematic diagrams illustrating an imaging method called "Flow-In" type among various Time-SLIP methods. In this Flow-In type Time-SLIP method, one inversion pulse, i.e., one selective inversion pulse B is applied as the Time-SLIP pulse. This selective inversion pulse B is applied to a selected region, i.e., a region indicated by the rectangular frame shown by the fine broken line in FIG. 4C. The selected region includes the imaging region $R_{IM}$, which is indicated by the thick solid square frame in FIG. 4C, and a part of region outside of the imaging region $R_{IM}$. Application of the selective inversion pulse B inverts the longitudinal magnetization of the blood of the blood vessels and the background in the imaging region, and the longitudinal magnetization of the blood in the vein γ in the selected region outside the imaging region, from positive to negative as shown in FIG. 4B. These longitudinal magnetizations recover with time, crossing a null point from a negative value, and then becoming a positive value.

The selective inversion pulse B is not applied to the artery α, which is located outside the selected region and the imaging region. Thus, the blood in the artery α flows into the imaging region while maintaining a large longitudinal magnetization value. Meanwhile, data acquisition is performed around the timing when the longitudinal magnetization of the background in the imaging region crosses the null point (i.e., around the time when BBTI elapses from the Time-SLIP pulse), and thereby, the blood of the artery α flowing into the imaging region from the outside can be depicted with high contrast with respect to the background of the imaging region and with respect to the blood flowing into the imaging region from the vein γ in the selected region.

FIG. 5A to FIG. 5D are sequence diagrams illustrating a conventional Time-SLIP pulse sequence using actual gating (respiratory gating and/or ECG gating). In the respiratory gating, the sequence element shown in FIG. 3A or FIG. 4A is repeatedly executed in synchronization with the respiratory gating signal detected by the respiratory sensor 700. In the ECG gating, the sequence element shown in FIG. 3A or FIG. 4A is repeatedly executed in synchronization with the ECG gating signal, for example, the R-wave signal detected by the electrocardiograph 710. Although FIG. 5A to FIG. 5D illustrate the Time-SLIP method using respiratory gating, the essential part of the description is the same when using the ECG gating.

FIG. 5A shows a respiratory cycle in which expiration and inspiration are repeated, and FIG. 5B shows respiratory gating signals detected by the respiratory sensor 700. The period of respiratory cycle is said to be 12 to 18 times per minute (i.e., 3 to 5 seconds) for a normal adult, for example. Since the respiratory cycle changes from moment to moment depending on the environment around the object and the psychological condition of the object, the period of the respiratory cycle does not always show a constant value.

FIG. 5C is a sequence diagram of the pulse sequence of the Time-SLIP method using respiratory gating under the setting of the first BBTI value (=BBTI (1)). Meanwhile, FIG. 5D is a sequence diagram of the pulse sequence of the Time-SLIP method using respiratory gating under the setting of the second BBTI value (=BBTI (2)).

Data acquisition is usually done around the center of the expiration period during the respiratory cycle. If the BBTI is set to be longer than the respiratory cycle, the data acquisition may be done every two cycles of the respiratory cycle, as shown in FIG. 5D.

In the respiratory gating, the Time-SLIP pulse starts in synchronization with the respiratory-gating signal. In the case of acquiring data by dividing k-space into a plurality of segments, the sequence element specified by the period from the Time-SLIP pulse to the next Time-SLIP pulse is repeated in synchronization with the respiratory-gating signal. In this way, it is possible to acquire k-space data at the same time phase of the respiratory cycle by the data acquisition sequence of every sequence element.

Note that, in the conventional Time-SLIP method using the respiratory gating, a dead time D exists between the trailing edge of the data acquisition sequence and the leading edge of the next Time-SLIP pulse, as can be seen in FIG. 5C and FIG. 5D. The dead time D may be rephrased as a waiting time.

The dead time D changes depending on the length of BBTI. The shorter the BBTI becomes, the longer the dead time D becomes. As a result, the overall imaging time becomes longer.

The main aim of the present embodiment is to reduce this dead time D and decrease the overall imaging time.

The main purpose of the above-descried actual gating, such as the respiratory gating and the ECG gating, is to suppress artifacts caused by body motions such as respiratory motions and pulsations. As shown in FIG. 5C and FIG. 5D described above, when k-space data are acquired by dividing k-space into a plurality of segments, the magnitude of MR signals (i.e., k-space data) fluctuates between segments due to body motions, and this fluctuation causes body-motion artifacts.

In the respiratory gating, data acquisition is performed in the same respiratory phase between segments, resulting in suppressing fluctuations of k-space data between segments due to body motions. Similarly, in the ECG gating, data acquisition is performed in the same cardiac time phase between segments, resulting in suppressing fluctuations of k-space data between segments due to body motions as well.

Meanwhile, it should be noted that body-motion artifacts depend on the sampling method of k-space. Specifically, as described below, it is known that body-motion artifacts are likely to occur when data acquisition is performed by using Cartesian sampling, while the body-motion artifacts are unlikely to occur when data acquisition is performed by using radial sampling.

In addition, it is also known that the degree of occurrence of the body motion artifacts varies depending on the imaging site (i.e., the target site of the object to be imaged). When the imaging site of the object is a chest or an abdomen, body-motion artifacts are likely to occur because the body motions due to respiration and heartbeat are large. Contrastively, when the imaging site is a part away from the chest and abdomen such as a head and inferior limb, body-motion artifacts are less likely to occur because such a part is less susceptible to the body motions due to respiration or heartbeat.

From the above viewpoint, the MRI apparatus 1 of the present embodiment is configured to select either of actual gating (such as respiratory gating and ECG gating) or virtual gating (without using actual gating) for executing a pulse sequence, depending on the sampling method of k-space data and/or the imaging site of the object (or, the imaging site of the patient).

Figure 6:
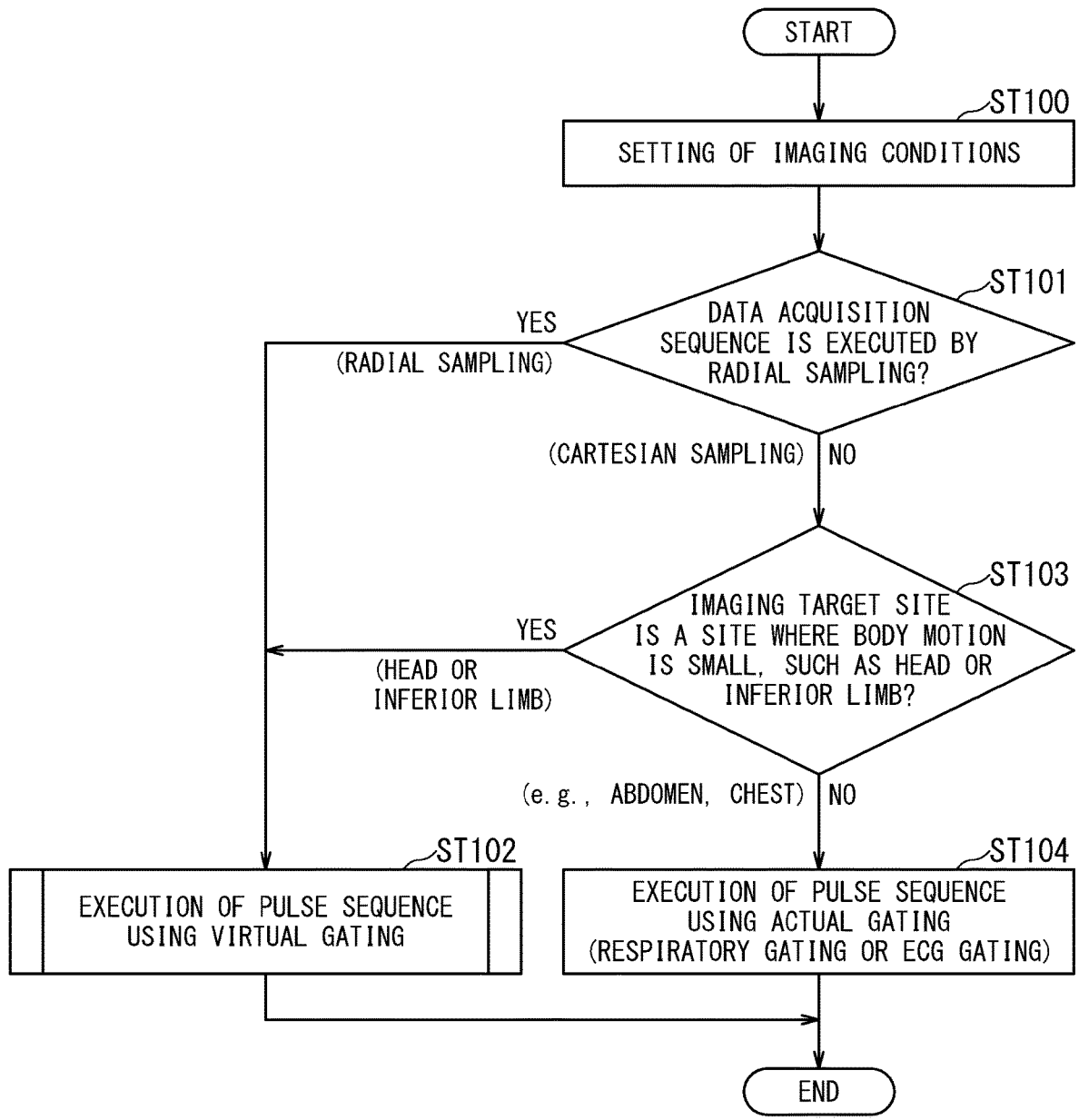
FIG. 6 is a flowchart illustrating processing to be executed by the MRI apparatus according to the present embodiment.

FIG. 6 is a flowchart illustrating processing of the MRI apparatus 1 according to the present embodiment.

In the step ST100 of FIG. 6, the imaging conditions or the imaging sequence are set by the user-interface control function F01 and the imaging sequence setting function F02. The following description mainly relates to the Time-SLIP method. Thus, the imaging conditions or imaging sequence set in the step ST100 is the imaging conditions or imaging sequence related to the Time-SLIP method.

In the next step ST101, the sampling type of the data acquisition sequence in the pulse sequence of the Time-SLIP method is determined based on the imaging conditions set in the step ST100. Specifically, if the data acquisition sequence is performed by radial sampling, the processing proceeds to the step ST102, in which a pulse sequence using virtual gating is executed. On the other hand, if the data acquisition sequence is performed by Cartesian sampling instead of radial sampling, the processing proceeds to the step ST103.

FIG. 7A to FIG. 9B are diagrams illustrating some of the Cartesian sampling and radial sampling.

Figure 7B:
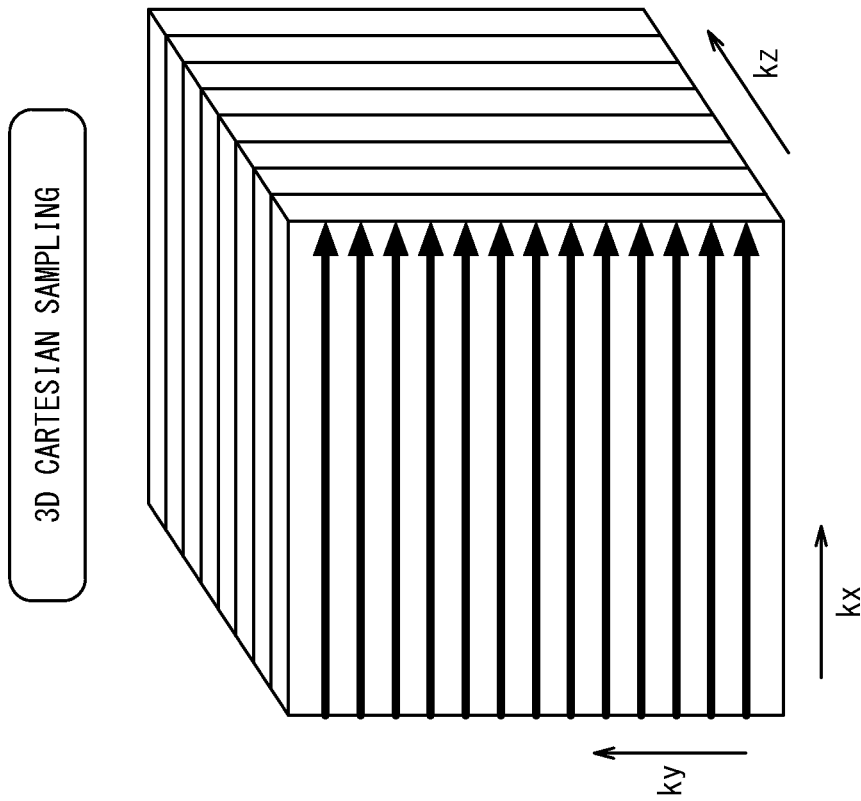
FIG. 7A and FIG. 7B are schematic diagrams illustrating Cartesian sampling.
Figure 7A:
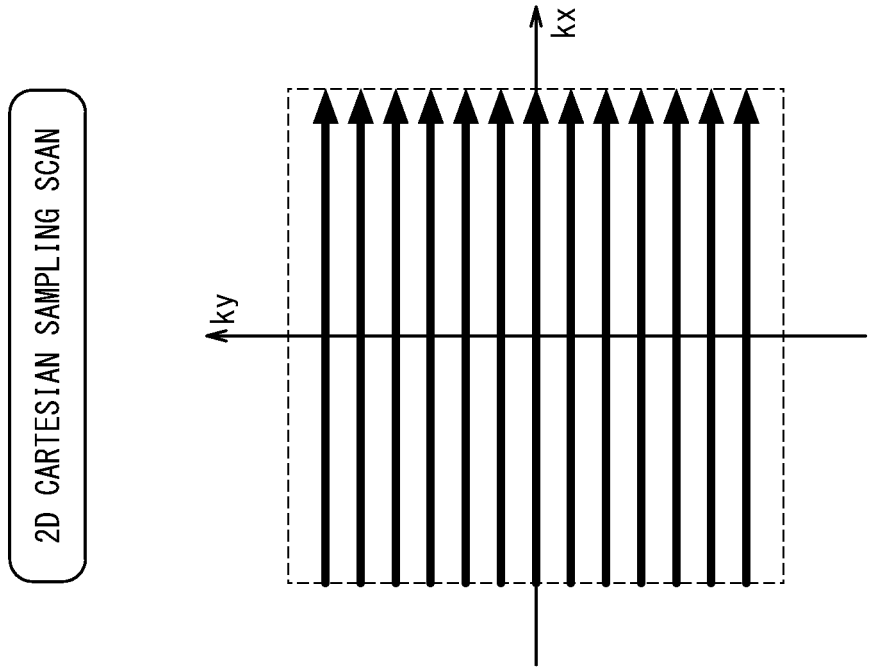

As examples of Cartesian scans, FIG. 7A illustrates two-dimensional (2D) Cartesian sampling, and FIG. 7B illustrates three-dimensional (3D) Cartesian sampling. In the 2D Cartesian scan, a readout direction and a phase encoding direction are set to be a kx direction and a ky direction, respectively, which are orthogonal to each other. In the 3D Cartesian scan, the slice encoding direction is further set to be a kz direction, which is orthogonal to both of the readout direction (i.e., kx direction) and the phase encoding direction (i.e., ky direction).

Figure 8A:
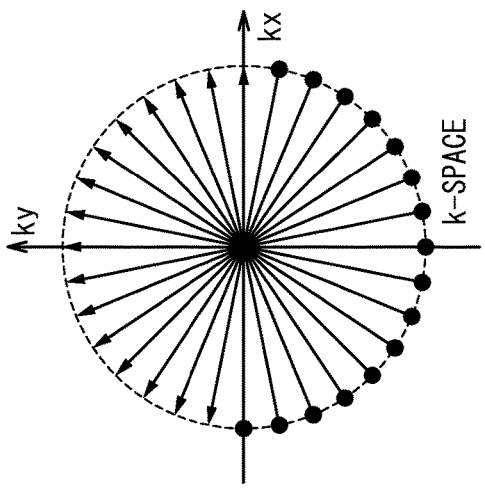
FIG. 8A to FIG. 8D are schematic diagrams illustrating two-dimensional radial sampling.
Figure 8B:
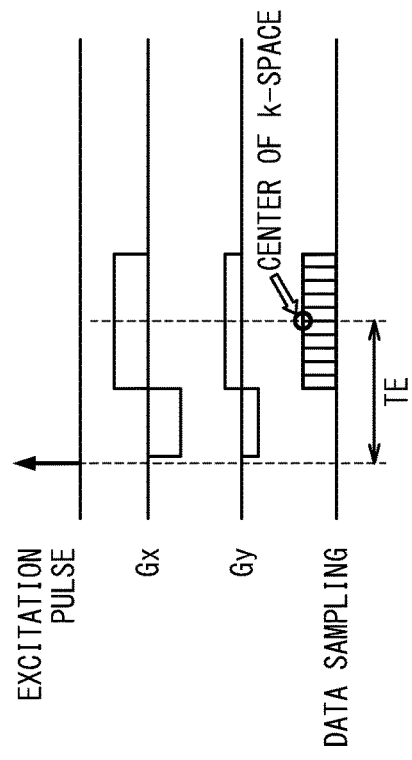

FIG. 8A to FIG. 8D are schematic diagrams illustrating two examples of two-dimensional radial sampling. The 2D radial sampling (1) shown in FIG. 8A is one example of so-called radial sampling in a narrow sense. FIG. 8B is a sequence diagram of radial sampling in the narrow sense. In the radial sampling in the narrow sense, MR signals are sampled, for each excitation pulse, along a line extending from one end of k-space (i.e., the position indicated by the black circle in FIG. 8A) through the center of k-space to the other end of k-space (i.e., the position indicated by the tip of the arrow in FIG. 8A). Then, data (i.e., MR signals) of the entire k space are acquired, while the angle of rotation of the line is sequentially changed from 0 degrees to 180 degrees, by changing the gradient magnetic field Gx in the X direction and the gradient magnetic field Gy in the Y direction.

Figure 8C:
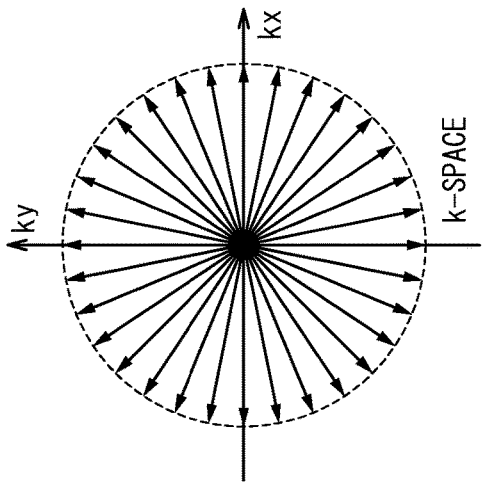
Figure 8D:
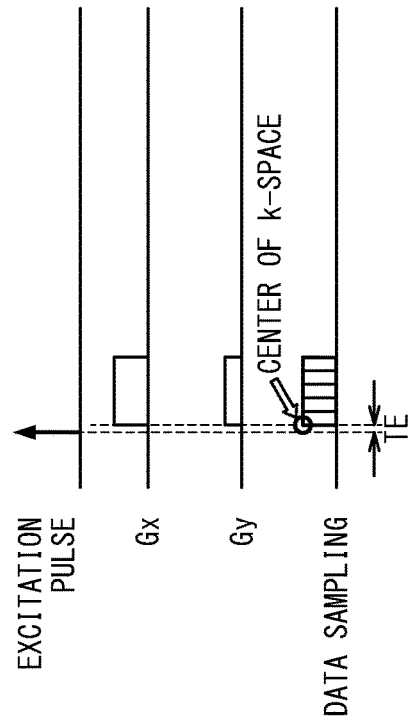

The 2D radial sampling (2) shown in FIG. 8C is another example of radial sampling corresponding to a two-dimensional UTE (ultra-short TE) method. FIG. 8D is a sequence diagram corresponding to the radial sampling of the 2D UTE method. The UTE method is an imaging method that achieves an extremely short echo time TE in order to image a tissue or imaging site having a very short transverse relaxation time.

In the radial sampling of the 2D UTE method, the MR signals are sampled, for each excitation pulse, along a line extending from the center of k-space to the end of k-space (i.e., the position indicated by the tip of the arrow in FIG. 8C). Then, data (i.e., MR signals) of the entire k-space are acquired, while sequentially changing the rotation angle of the line from 0° to 360°, by changing the gradient magnetic field Gx in the X direction and the gradient magnetic field Gy in the Y direction.

Figure 9B:
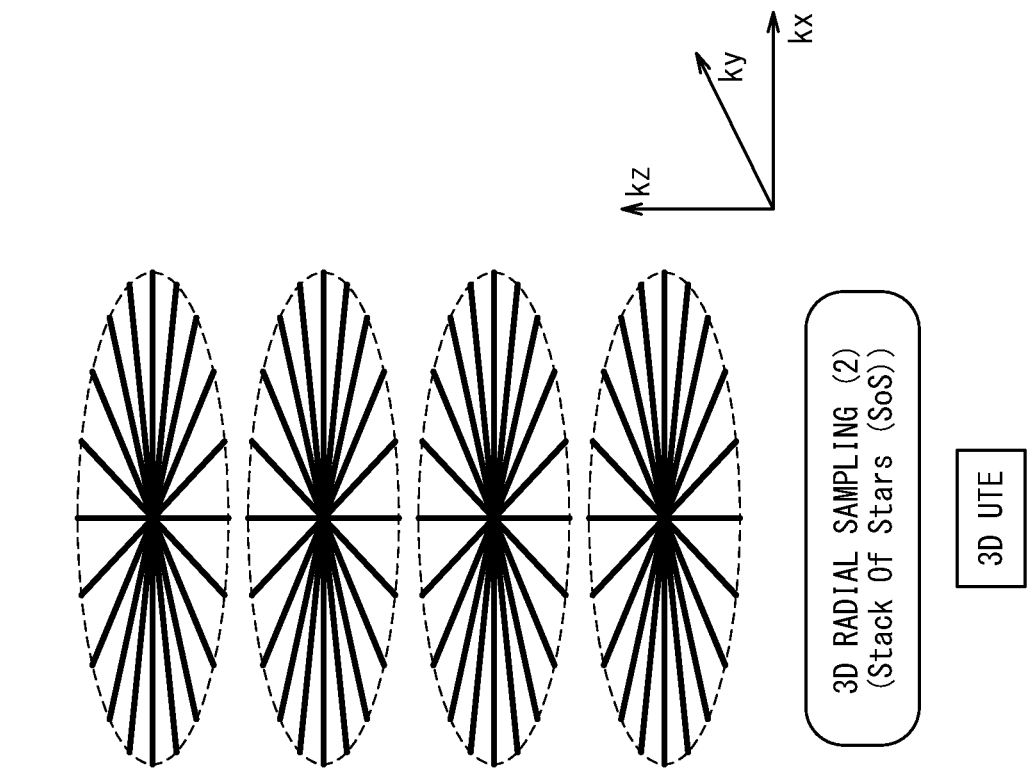
FIG. 9A and FIG. 9B are schematic diagrams illustrating three-dimensional radial sampling.
Figure 9A:
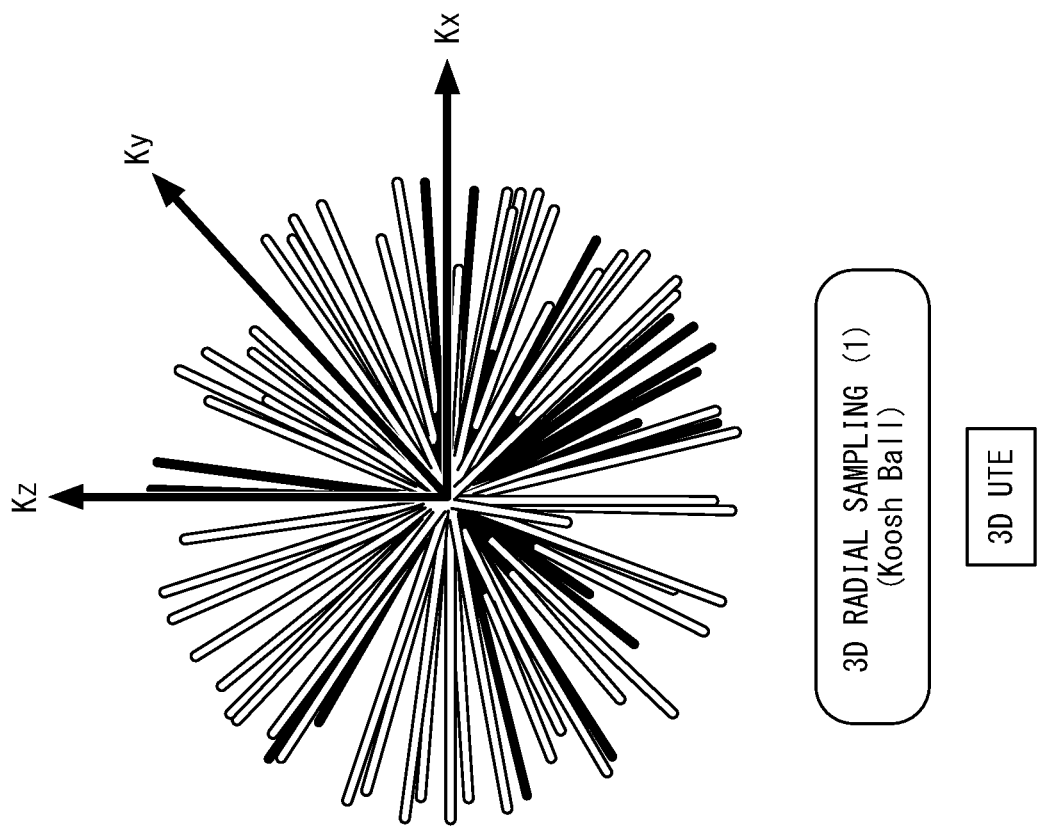

FIG. 9A and FIG. 9B are schematic diagrams illustrating two examples of three-dimensional radial sampling. The 3D radial sampling (1) shown in FIG. 9A is a so-called Koosh ball type radial sampling. The Koosh ball type radial sampling is a sampling method used in the three-dimensional UTE method. In the Koosh ball type radial sampling, MR signals are sampled along a number of lines, which extend from the center of k-space to respective points distributed almost uniformly over the entire virtual sphere surface outside k-space, so that data of the entire three-dimensional k-space can be acquired.

The sequence diagram of the three-dimensional UTE method using the Koosh ball type radial sampling can be obtained by adding the gradient magnetic field Gz in the Z-axis direction, which changes in the same manner as Gx and Gy, to the sequence diagram of the two-dimensional UTE shown in FIG. 8D.

The 3D radial sampling (2) shown in FIG. 9B is an SoS (Stack of Stars) type radial sampling. In the SoS type radial sampling, three-dimensional k-space data are acquired by acquiring a plurality of two-dimensional radial sampling planes (for example, kx-ky plane) in a direction orthogonal to this plane (for example, in the kz direction).

Returning to FIG. 6, in the step ST101, if the set imaging conditions or the set type of data acquisition sequence correspond to one of the types of radial sampling described above, the processing proceeds to the step ST102. Details of the processing in the step ST102 will be described below.

If the set imaging conditions or the selected type of data acquisition sequence uses the Cartesian sampling, not the radial sampling described above, the processing proceeds to the step ST103.

In the step ST103, based on the set imaging conditions, it is determined whether the imaging target site is a site with small body motions (for example, a head or inferior limbs) or a site with large body motions (for example, a chest or abdomen).

If the imaging target site is the head or inferior limbs, body motions due to respiration and heartbeat are small, and thus, even when using Cartesian sampling for the data acquisition sequence, body-motion artifacts are unlikely to occur. Hence, in this case, the processing proceeds to the step ST102, in which a pulse sequence using virtual gating, specifically, a pulse sequence based on the Time-SLIP method is executed. That is, when the imaging target site is the head or the inferior limbs, virtual gating can be applied to all the sampling methods shown in FIGS. 7 to 9 including the Cartesian sampling.

If the data acquisition sequence is executed by using Cartesian sampling "and" the imaging target site is a site with large body motions due to respiration and/or heartbeat, such as the abdomen or chest, in order to suppress body-motion artifacts, the MRI apparatus 1 executes a pulse sequence based on the Time-SLIP method using actual gating such as respiratory gating and ECG gating, which are shown in FIG. 5A to FIG. 5D, for example.

The processing of the steps ST101 and ST103 in FIG. 6 is performed by the gating selection function F03 in FIG. 2.

Next, processing related to execution of the Time-SLIP pulse sequence using virtual gating will be described in detail by referring to the flowchart of FIG. 10 and the sequence diagrams of FIG. 11A to FIG. 11C.

FIG. 11A is an overall sequence diagram of the Time-SLIP pulse sequence using virtual gating, and FIG. 11C is a sequence diagram in which one sequence element of the Time-SLIP pulse sequence is extracted and enlarged.

As described above, the sequence element is defined by the behavior of the RF pulse and the gradient magnetic field during the period from the leading edge of the Time-SLIP pulse to the leading edge of the next Time-SLIP pulse. The sequence element includes at least a Time-SLIP pulse and a data acquisition sequence that is executed after a delay time BBTI from the Time-SLIP pulse.

As mentioned above, the Time-SLIP pulse may include both of the non-selective inversion pulse A and the selective inversion pulse B (Flow-Out type), or may include only the selective inversion pulse B (Flow-In type). FIG. 11 shows the Flow-Out type Time-SLIP pulse sequence.

In execution of a pulse sequence using virtual gating, it is important to calculate the repetition period $T_{IR-IR}$ of virtual gating. The repetition period $T_{IR-IR}$ of virtual gating is the repetition period $T_{IR-IR}$ of the inversion pulse (i.e., Time-SLIP pulse), and is also the repetition period $T_{IR-IR}$ of the sequence element.

As can be seen from FIG. 11A to FIG. 11C, the repetition period $T_{IR-IR}$ of virtual gating is the sum of duration $D_{IR}$ of the Time-SLIP pulse, BBTI, period $T_{ack}$ of the data acquisition sequence, and waiting time WT. The waiting time WT can be considered as the time during which the longitudinal magnetization tilted by the excitation pulse train of the data acquisition sequence is sufficiently recovered, or the time during which the transverse magnetization generated by the excitation pulse train of the data acquisition sequence sufficiently disappears.

Figure 10:
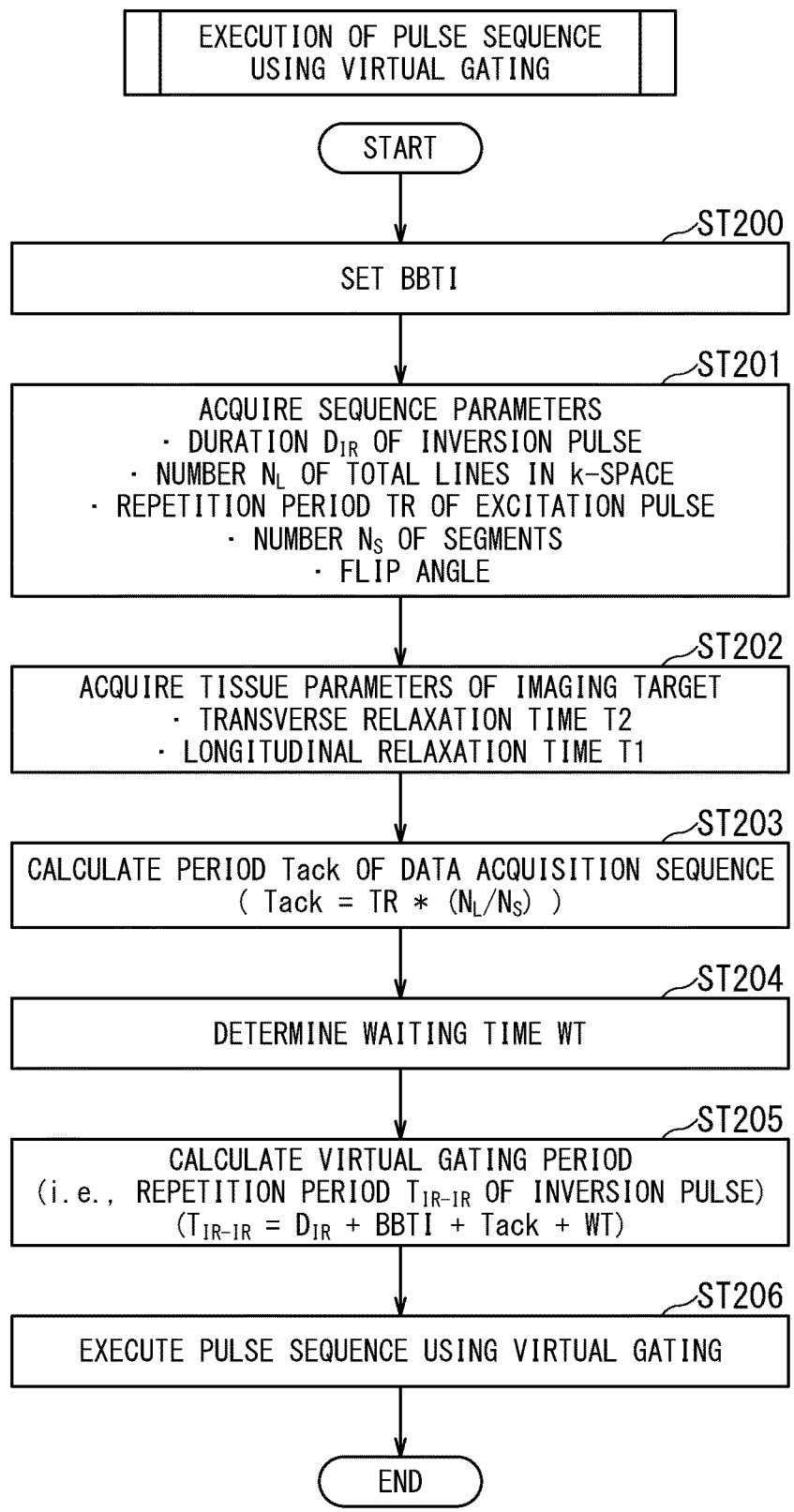
FIG. 10 is a flowchart illustrating processing related to execution of a Time-SLIP pulse sequence using virtual gating.

The steps ST200 to ST205 in FIG. 10 are processing for calculating the repetition period $T_{IR-IR}$ of virtual gating. The processing from the steps ST200 to ST205 is performed by the virtual gating period calculation function F04 shown in FIG. 2.

In the step ST200, BBTI, which is set by a user via the user interface 401, is acquired. For example, for the Flow-Out type Time-SLIP method, the value of BBTI is set by a user in consideration of distance between the imaging region and the selected region (i.e., application region of the selective inversion pulse B) set on the upstream side of the imaging region, velocity of blood flowing from the selected region into the imaging region, and recovery time of the longitudinal magnetization of the background in the imaging region.

In the step ST201, sequence parameters are acquired. Specifically, in the step ST201, the values of various parameters in the Time-SLIP pulse sequence, which are set by the user-interface control function F01 and/or the imaging sequence setting function F02, are acquired.

More specifically, the values of various parameters such as (a) the duration $D_{IR}$ of the inversion pulse, i.e., duration $D_{IR}$ of the Time-SLIP pulse, (b) number $N_L$ of total lines in k-space data, (c) number $N_s$ of segments when k-space is divided into a plurality of segments to acquire k-space data, (d) repetition period TR of the excitation pulse used in the data acquisition sequence, and (e) flip angle α of the excitation pulse, are acquired as sequence parameters.

In the step ST202, tissue parameters of the imaging target are acquired. The tissue parameters are, for example, transverse relaxation time T2 and longitudinal relaxation time T1 of the imaging target. The values of these tissue parameters can be estimated to some extent from, for example, the imaging target site of the body and/or other imaging conditions. For example, when the imaging target site is the lung field, it can be estimated that the transverse relaxation time T2 shows a very short value (for example, 1 ms or less). Alternatively, when the imaging target site is the head and the imaging target tissue is CSF, it can be estimated that the transverse relaxation time T2 shows a very long value (for example, about 1000 ms).

The flip angle of the excitation pulse acquired in the step ST201, the transverse relaxation time T2 and the longitudinal relaxation time T1 acquired (or estimated) in the step ST202 are used for determining the waiting time WT.

In the next step ST203, the period $T_{ack}$ of the data acquisition sequence is calculated. As can be seen from the sequence diagram of FIG. 11C, the period $T_{ack}$ of the data acquisition sequence is the product of the number N of excitation pulses per segment (i.e., number N of lines for acquiring k-space data per segment) and the repetition period TR of the excitation pulse. The number N of lines for acquiring k-space data per segment is a value obtained by dividing the number $N_L$ of total lines of k-space data by the number $N_s$ of segments. Thus, the period $T_{ack}$ of the data acquisition sequence can be calculated by applying the number $N_L$ of the total lines and the number $N_s$ of segments of the k-space data acquired in the step ST201 to Expression 1 as follows.

$$T_{ack}=N*TR=(N_L/N_s)*TR \quad \text{Expression 1}$$

In the next step ST204, the waiting time WT is determined. The waiting time WT is the time from the trailing edge of the data acquisition sequence to the leading edge of the next Time-SLIP pulse. As described above, the waiting time WT can be considered as the time during which the longitudinal magnetization tilted by the excitation pulse train of the data acquisition sequence is sufficiently recovered, or the time during which the transverse magnetization generated by the excitation pulse train of the data acquisition sequence sufficiently disappears. If the waiting time WT can be determined to be short, the overall length of the Time-SLIP pulse sequence can be decreased, and thus, the imaging time based on the Time-SLIP method can be decreased.

Figure 12:
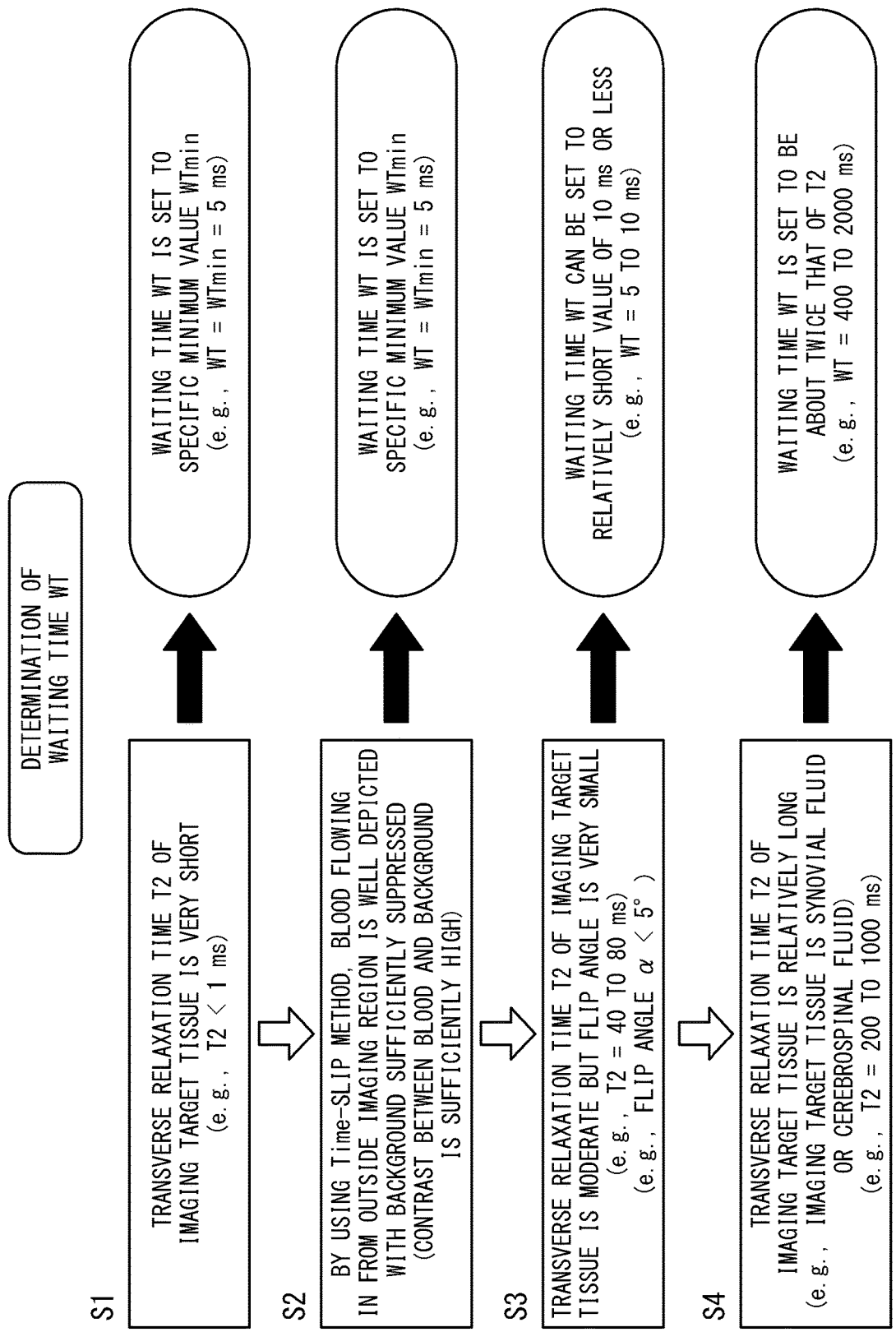
FIG. 12 is a schematic diagram illustrating a concept for determining a waiting time.

FIG. 12 is a schematic diagram illustrating a concept for determining the waiting time WT.

In the step S1, it is determined whether the transverse relaxation time T2 of the tissue of the imaging target is very short. If so, for example T2<1 ms, the waiting time WT is determined to be the predetermined minimum value WTmin, for example 5 ms.

In the next step S2, it is determined whether, by using the Time-SLIP method, blood flowing in from the outside imaging region is well depicted with the background sufficiently suppressed. If so, the contrast between blood and background can be considered to be sufficiently high. In this case as well, the waiting time WT is set to be the predetermined minimum value WTmin, for example 5 ms.

Figure 13B:
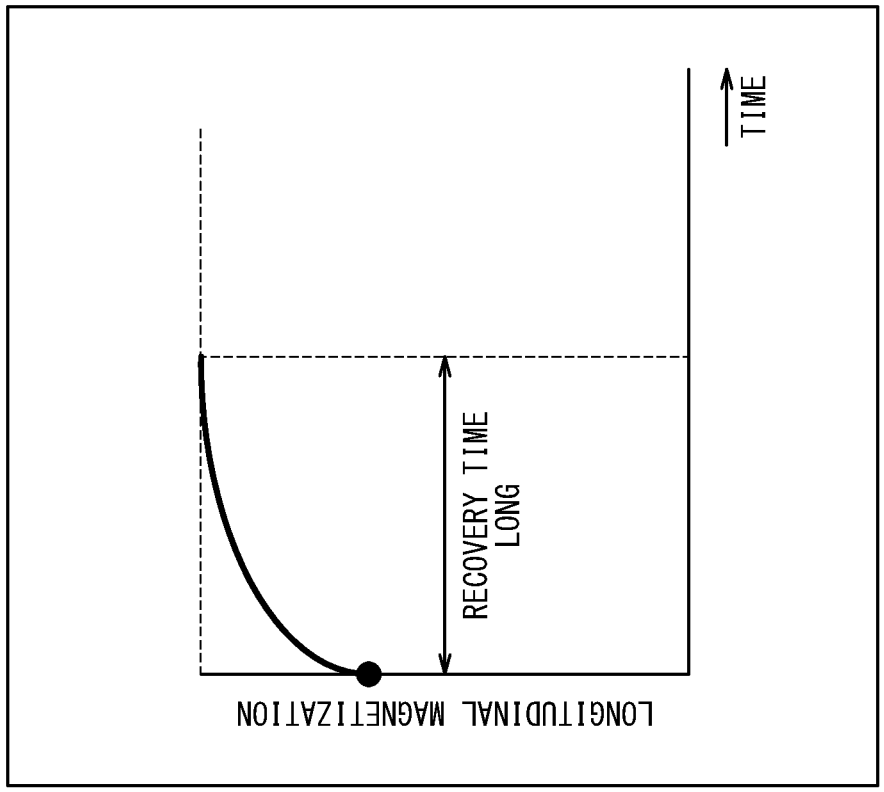
FIG. 13A and FIG. 13B are schematic diagrams showing that a recovery time of longitudinal magnetization differs depending on magnitude of the flip angle.
Figure 13A:
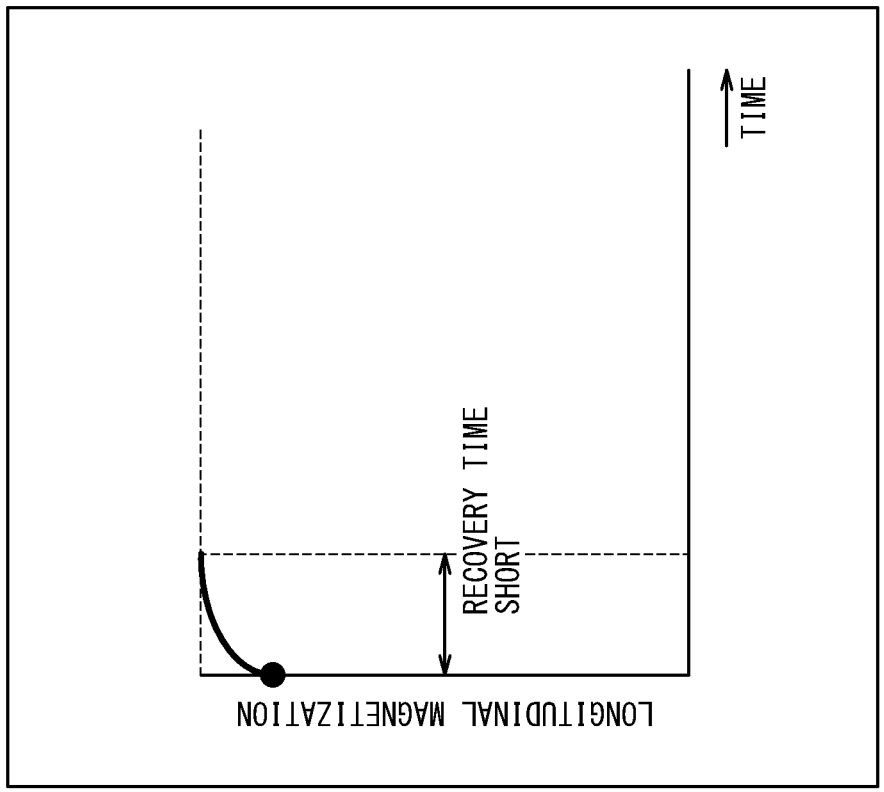

In the next step S3, it is determined whether the flip angle is very small, even when the transverse relaxation time T2 of the imaging target tissue is moderate. When the flip angle is small, for example, when the flip angle is 5° as shown in FIG. 13A, the recovery time of the longitudinal magnetization is shorter than the case where the flip angle is 20° as shown in FIG. 13B. In this case, the waiting time WT can be determined to be short as well. For example, even when the transverse relaxation time is moderate, such as T2=40 to 80 ms, if the flip angle α is smaller than, for example, 50, the waiting time WT is determined to be a relatively small value of 10 ms or less, for example, WT=5 to 10 ms.

Meanwhile, as shown in the step S4, when the transverse relaxation time T2 of the imaging target tissue is relatively long, for example, when the imaging target tissue is the synovial fluid or the CSF, the transverse relaxation time T2 shows a relatively long value such as T2=200 to 1000 ms. In such a case, the waiting time WT also must be determined to be a relatively long value. For example, the waiting time WT is about twice that of T2, and thus, in this case, the waiting time WT is determined to be a value of about 400 to 2000 ms.

Returning to FIG. 10, after the waiting time WT is determined as described above in the step ST204, in the next step ST205, the virtual gating period (i.e., repetition period $T_{IR-IR}$ of the Time-SLIP pulse) is calculated. Specifically, the virtual gating period $T_{IR-IR}$ is calculated by using Expression 2 as follows.

$$T_{IR-IR}=D_{IR}+BBTI+T_{ack}+WT \quad \text{Expression 2}$$

Finally, in the step ST206, virtual gating is used to perform a Time-SLIP pulse sequence as shown in FIG. 11A to FIG. 11C.

As to execution of the Time-SLIP pulse sequence, a virtual gating signal, which is shown in FIG. 11B, may be actually generated from the calculated virtual gating period $T_{IR-IR}$, and then, the Time-SLIP pulse sequence may be executed in synchronization with the generated virtual gating signal.

Alternatively, the sequence element of the Time-SLIP sequence shown in FIG. 11C may be repeatedly executed during the calculated virtual gating period $T_{IR-IR}$, without actually generating and using the virtual gating signal.

FIG. 14A to FIG. 14C, and FIG. 15 are charts illustrating comparison of imaging time between the Time-SLIP method using virtual gating according to the present embodiment and conventional respiratory gating.

FIG. 14A shows the respiratory cycle and FIG. 14B shows the Time-SLIP pulse sequence using conventional respiratory gating. In the Time-SLIP pulse sequence shown in FIG. 14B, three segments from the segments 1 to 3 are extracted and shown.

FIG. 14C is a timing chart illustrating a Time-SLIP pulse sequence using virtual gating according to the present embodiment. In the sequence shown in FIG. 14C, three segments from the segments 1 to 3 are extracted and shown similarly to FIG. 14B.

In the Time-SLIP pulse sequence using the conventional respiratory gating, there exists a dead time D between the trailing edge of the data acquisition sequence and the leading edge of the next Time-SLIP pulse, because the data acquisition sequence is executed at the same time phase of the respiratory cycle in order to suppress the body-motion artifacts caused by respiratory motions. The length of the dead time D depends on the length of the respiratory cycle and BBTI, and can be non-negligibly long. Thus, the presence of the dead time D is the major factor for lengthening the imaging time of the conventional Time-SLIP method using the respiratory gating.

In the Time-SLIP pulse sequence using virtual gating according to the present embodiment, the waiting time WT is used instead of the dead time D. The waiting time WT is a value determined without depending on respiration and/or heartbeat, and is determined in consideration of parameters such as the T2 value of the imaging target tissue and/or the flip angle of the excitation pulse of the data acquisition sequence. The waiting time WT is determined to be a very short value, for example, about 5 to 10 ms, except in the case for imaging a tissue having a very long transverse relaxation time T2 such as cerebrospinal fluid and synovial fluid.

Hence, the imaging time of the Time-SLIP pulse sequence using the virtual gating according to the present embodiment is significantly decreased as compared with the imaging time using the conventional respiratory gating.

FIG. 15 illustrates one case of calculation results indicating how the imaging time is decreased with the Time-SLIP pulse sequence using the virtual gating according to the present embodiment. Note that the following parameter values are assumed as prerequisites for the calculation.

Duration $D_{IR}$ of Time-SLIP pulse: 100 ms
Number $N_L$ of total lines in k-space: 16000 lines
Number $N_s$ of segments: 64
Number ($N_L/N_s$) of lines per segment: 250 lines
Repetition period TR of excitation pulse: 4 ms In this case, the data acquisition time $T_{ack}$ per segment is 1000 ms (4 ms*250 lines).

Further assuming that BBTI is set to 1000 ms, the total time Ta ($=D_{IR}+BBTI+T_{ack}$) from the leading edge of the Time-SLIP pulse to the trailing edge of the data acquisition period is 2100 ms.

Assuming that the repetition period $T_{resp}$ of respiratory gating (i.e., period $T_{resp}$ of respiratory-cycle) is 5 seconds (5000 ms), the dead time D in the Time-SLIP pulse sequence using the conventional respiratory gating is, $T_{resp}$−Ta=5000−2100=2900 ms.

The total imaging time $T_{total}$ of the Time-SLIP pulse sequence using the conventional respiratory gating is 320 seconds (5 minutes and 20 seconds) calculated as follows.

$$T_{total}=T_{resp}*\text{Number of segments}=5\text{ seconds}*64=320\text{ seconds}$$

By contrast, assuming a case where, by using the Time-SLIP method, blood flowing in from the outside imaging region is well depicted with the background sufficiently suppressed, the waiting time WT can be set to the predetermined minimum value WTmin (=5 ms).

Thus, the repetition period $T_{IR\text{-}IR}$ of virtual gating in the Time-SLIP pulse sequence using the virtual gating of the present embodiment (i.e., repetition period $T_{IR\text{-}IR}$ of the Time-SLIP pulse) is $T_{IR\text{-}IR}=Ta+WT=2100+5=2105$ ms.

As a result, when using virtual gating of the present embodiment, the total imaging time $T_{total}$ is 135 seconds (i.e., 2 minutes and 15 seconds) calculated as follows.

$$T_{total}=T_{IR\text{-}IR}*\text{number of segments}=2105\text{ ms}*64=135\text{ seconds}$$

As described above, according to the above numerical example, the total imaging time is 320 seconds (5 minutes and 20 seconds) in the conventional respiratory gating, whereas the total imaging time in virtual gating of the present embodiment is 135 seconds (2 minutes and 15 seconds), which shows that the present embodiment can significantly reduce the imaging time.

In addition, it should be noted that, in the conventional respiratory gating, there is a possibility that the magnitude of the acquired MR signals fluctuates due to fluctuations in the length of the respiratory cycle. Contrastively, in the virtual gating of the present embodiment, the length of the virtual gating cycle is always constant. Thus, in the virtual gating of the present embodiment, the magnitude of the MR signals does not fluctuate due to the fluctuation in the length of the acquisition cycle, and occurrence of artifact due to the amplitude fluctuation can be suppressed.

As described above, the MRI apparatus of the present embodiment can decrease the imaging time of non-contrast enhanced imaging.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a scanner that includes a static magnetic field magnet configured to generate a static magnetic field, a gradient coil configured to generate a gradient magnetic field, and a WB (Whole Body) coil configured to apply an RF pulse to an object; and
processing circuitry configured to
set a pulse sequence in which a sequence element is repeated, the sequence element including at least an inversion pulse and a data acquisition sequence executed after a delay time from the inversion pulse, and
cause the scanner to execute the pulse sequence by using virtual gating.

2. The magnetic resonance imaging apparatus according to claim 1, wherein the processing circuitry is further configured to select which of the virtual gating and actual gating is used to execute the pulse sequence, based on a type of the data acquisition sequence, the actual gating including at least one of respiratory gating and ECG-gating.

3. The magnetic resonance imaging apparatus according to claim 2, wherein the processing circuitry is further configured to:
select the virtual gating when the data acquisition sequence is a sequence using radial sampling; and
select the actual gating when the data acquisition sequence is a sequence using Cartesian sampling.

4. The magnetic resonance imaging apparatus according to claim 3, wherein the sequence using radial sampling selected by the processing circuitry includes at least one of a UTE (Ultra-short TE) sequence and an SoS (Stack of Stars) sequence.

5. The magnetic resonance imaging apparatus according to claim 1, wherein the processing circuitry is further configured to select which of the virtual gating and actual gating is used to execute the pulse sequence, based on an imaging site of the object, the actual gating including at least one of respiratory gating and ECG-gating.

6. The magnetic resonance imaging apparatus according to claim 5, wherein the processing circuitry is further configured to:
select the virtual gating when the imaging site is a head or an inferior limb; and
select the actual gating when the imaging site is an abdomen or a chest.

7. The magnetic resonance imaging apparatus according to claim 1, wherein:
a repetition period of the sequence element in the virtual gating is a repetition period of the inversion pulse; and
the processing circuitry is further configured to calculate the repetition period of the inversion pulse by using at least a delay time from the inversion pulse to a leading edge of the data acquisition sequence, a duration of the data acquisition sequence, and a waiting time from a trailing edge of the data acquisition sequence to a next inversion pulse.

8. The magnetic resonance imaging apparatus according to claim 7, wherein the processing circuitry is further configured to calculate the repetition period $T_{IR\text{-}IR}$ of the inversion pulse in the virtual gating by using a duration $D_{IR}$ of the inversion pulse, a delay time BBTI from the inversion pulse to the leading edge of the data acquisition sequence, a period $T_{ack}$ of the data acquisition sequence, and the waiting time, WT, from a trailing edge of the data acquisition sequence to a next inversion pulse, based on an expression as follows.

$$T_{IR\text{-}IR}=D_{IR}+\text{BBTI}+T_{ack}+WT$$

9. The magnetic resonance imaging apparatus according to claim 7, wherein, when generating an image from data acquired over a plurality of segments, the processing circuitry is further configured to calculate a period $T_{ack}$ of the data acquisition sequence by using a number of total lines $N_L$ with which k-space is filled to generate the image, a number $N_S$ of the plurality of segments, and a repetition time TR of an excitation pulse in the data acquisition sequence based on an expression $T_{ack}=TR*(N_L/N_S)$.

10. The magnetic resonance imaging apparatus according to claim 7, wherein, when generating an image from data acquired over a plurality of segments, the processing circuitry is further configured to calculate the repetition period of the inversion pulse such that the repetition period of the inversion pulse is constant during an entire period of data acquisition over the plurality of segments.

11. The magnetic resonance imaging apparatus according to claim 7, wherein the processing circuitry is further configured to calculate the waiting time based on a T2 value of an imaging target.

12. The magnetic resonance imaging apparatus according to claim 7, wherein the processing circuitry is further configured to calculate the waiting time such that the waiting time becomes 2 to 5 times a T2 value of an image target.

13. The magnetic resonance imaging apparatus according to claim 7, wherein the processing circuitry is further configured to calculate the waiting time based on a flip angle of an excitation pulse in the data acquisition sequence.

14. The magnetic resonance imaging apparatus according to claim 7, wherein, when the data acquisition sequence is applied at a timing when a background of an imaging region is suppressed by application of the inversion pulse, the processing circuitry is further configured to set the waiting time to a predetermined minimum time.

15. The magnetic resonance imaging apparatus according to claim 3, further comprising a user interface by which a user can input or select data,
wherein the user interface is configured to input or select whether the data acquisition sequence is a sequence using the radial sampling or a sequence using the Cartesian sampling.

16. The magnetic resonance imaging apparatus according to claim 5, further comprising a user interface by which a user can input or select data,
wherein the user interface is configured to input or select an imaging target site of the object.

17. The magnetic resonance imaging apparatus according to claim 1, wherein the pulse sequence set by the processing circuitry is a pulse sequence based on a Time-SLIP (time-spatial labeling inversion pulse) method.

* * * * *